(12) United States Patent
Hiligsmann et al.

(10) Patent No.: US 11,733,318 B2
(45) Date of Patent: Aug. 22, 2023

(54) SENSOR PACKAGE

(71) Applicant: MELEXIS TECHNOLOGIES SA, Bevaix (CH)

(72) Inventors: Vincent Hiligsmann, Bevaix (CH); Wolfram Kluge, Bevaix (CH); David Ihle, Bevaix (CH); Jian Chen, Bevaix (CH); Jorg Rudiger, Bevaix (CH); Sascha Beyer, Bevaix (CH)

(73) Assignee: MELEXIS TECHNOLOGIES SA, Bevaix (CH)

(*) Notice: Subject to any disclaimer, the term of this patent is extended or adjusted under 35 U.S.C. 154(b) by 28 days.

(21) Appl. No.: 16/963,352

(22) PCT Filed: Jan. 22, 2019

(86) PCT No.: PCT/EP2019/051441
§ 371 (c)(1),
(2) Date: Jul. 20, 2020

(87) PCT Pub. No.: WO2019/141861
PCT Pub. Date: Jul. 25, 2019

(65) Prior Publication Data
US 2021/0373091 A1  Dec. 2, 2021

(30) Foreign Application Priority Data
Jan. 22, 2018 (EP) .................................... 18152828

(51) Int. Cl.
*G01R 33/04* (2006.01)
*G01R 33/00* (2006.01)
*G01D 5/20* (2006.01)

(52) U.S. Cl.
CPC ......... *G01R 33/0047* (2013.01); *G01D 5/204* (2013.01); *G01R 33/04* (2013.01)

(58) Field of Classification Search
CPC .. G01R 33/0047; G01R 33/04; G01R 27/267; G01D 5/00; G01D 5/20; G01D 5/204;
(Continued)

(56) References Cited

U.S. PATENT DOCUMENTS 6,853,178 B2    2/2005  Hayat-Dawoodi
8,629,539 B2    1/2014  Milano et al.
(Continued)

FOREIGN PATENT DOCUMENTS

CN      206671517 U    11/2017
DE      202008013715 U1  1/2009
(Continued)

OTHER PUBLICATIONS

Office Action from corresponding EP Application No. 18152822, dated Sep. 3, 2020.
(Continued)

*Primary Examiner* — Son T Le
(74) *Attorney, Agent, or Firm* — Workman Nydegger

(57) ABSTRACT

A sensor package comprises a non-conductive substrate, at least two electrically conductive coils located at a first side of the non-conductive substrate, an evaluation circuit located at a second side of the non-conductive substrate opposing the first side of the non-conductive substrate and conductive connections between the at least two electrically conductive coils and the evaluation circuit.

24 Claims, 11 Drawing Sheets

(58) Field of Classification Search
CPC .......... G01P 3/488; G01V 3/10; G01V 3/104;
G01V 3/105; G01V 3/107; G01V 3/108;
G01V 3/28
See application file for complete search history.

(56) References Cited

U.S. PATENT DOCUMENTS

| | | | |
|---|---|---|---|
| 2001/0005133 A1 | 6/2001 | Madni et al. | |
| 2003/0151402 A1 | 8/2003 | Kindler | |
| 2006/0219436 A1 | 10/2006 | Taylor et al. | |
| 2009/0217711 A1* | 9/2009 | May | G01D 5/145 324/207.2 |
| 2011/0046906 A1 | 2/2011 | Albertini | |
| 2011/0181302 A1 | 7/2011 | Shao et al. | |
| 2012/0161759 A1 | 6/2012 | Pozzati et al. | |
| 2014/0217533 A1 | 8/2014 | Pagani | |
| 2014/0247042 A1 | 9/2014 | Lei et al. | |
| 2014/0327432 A1* | 11/2014 | Elliott | G01D 5/2066 324/207.16 |
| 2015/0153378 A1 | 6/2015 | Kim et al. | |
| 2016/0313142 A1 | 10/2016 | Muehlfeld et al. | |
| 2017/0175259 A1 | 6/2017 | Lee et al. | |
| 2018/0052065 A1* | 2/2018 | Sipila | G01L 3/102 |

FOREIGN PATENT DOCUMENTS

| | | |
|---|---|---|
| DE | 102008044739 A1 | 3/2009 |
| EP | 1746430 A1 | 1/2007 |
| EP | 2034201 A2 | 3/2009 |
| KR | 20170088184 A * | 8/2017 |

OTHER PUBLICATIONS

European Office Action from corresponding EP Application No. 18152828.2, dated Mar. 23, 2020.
Extended European Search Report and Written Opinion from corresponding EP Application No. 18152828.2, dated Jul. 25, 2018.
International Search Report and Written Opinion from PCT Application No. PCT/EP2019/051441, dated Mar. 27, 2019.
Office Action from corresponding Chinese Application No. 20198007172.2, dated Dec. 17, 2021.

* cited by examiner

SENSOR PACKAGE

TECHNICAL FIELD

The current application concerns a sensor package, in particular an inductive sensor package for rotary and/or linear position sensing.

BACKGROUND

Apparatuses for measuring a magnetic field property of a magnetic field are often referred to as magnetic field sensors or magnetic sensors. Typically, these sensors comprise sensor elements configured to sense a property of the magnetic field. For example, a Hall element, an inductive element, such as a coil, or a magnetoresistance element. These sensor elements may also be referred to as magnetic field sensitive elements or sensing elements.

The sensor elements are influenced by a magnetic field and output a signal indicative of the sensed magnetic field. Thereby, direct or indirect measurements may be used. For a direct measurement, for example, the magnetic field strength of the magnetic field encountered can be measured, whereas for an indirect measurement the magnetic flux can be measured by measuring a quantifiable property induced by the magnetic flux, for example an induced current or voltage.

However, also other elements of the sensor, i.e. the non-sensing elements, are influenced by the magnetic field. For example, a magnetic field may cause eddy currents in the other elements of the sensor such as conductive elements, which electrically connect elements of the sensor, and may therefore impact the performance of integrated circuits included within the magnetic sensors. The integrated circuit typically performs the task of calculating the output of the sensor, any effect on the operation of the integrated circuit may impact the performance and the accuracy of the sensor. Known sensors comprise a lead frame, which is used for wiring the different elements of the sensor and the integrated circuit is mounted on the lead frame. Such a lead frame is prone to the generation of eddy currents. For example, if the magnetic field, which is to be sensed by the sensor, changes with time, eddy currents are induced in the lead frame, because the lead frame is made of conductive material. These eddy currents create an opposing magnetic field, which affects the accuracy of the sensor, for example by disturbing not only the operation of the integrated circuit, but also of the sensing elements. Consequently, these sensors are optimized for sensing static magnetic fields and suffer from high frequency changes in the magnetic fields. Hence, it can be said these sensors are not robust to alternating magnetic fields. Therefore, there is a need for sensors with reduced generation of eddy currents.

Prior solutions either concentrate on changing the impact of the eddy currents or on shielding the integrated circuit from the eddy currents. An example of an impact reducing concept is given in U.S. Pat. No. 6,853,178 B2, in which slots are introduced into the lead frame, which are configured to disrupt eddy currents in the lead frame. However, even if slots introduced into the lead frame may reduce eddy current flow, the magnitude of the eddy currents is not changed and therefore eddy currents will still have a substantial effect on the accuracy of the sensor.

An example of a shielding concept is described in U.S. Pat. No. 8,629,539 B2. In this case, a non-conductive paddle is placed on the lead frame and the integrated circuit. This shielding concept may reduce the eddy currents for the integrated circuit, but not for the surrounding other elements. Furthermore, the non-conductive paddle located within a semi-conductive material increases the complexity of the sensor, which makes the manufacturing process more difficult.

Hence, one of the objects of the current application is to overcome the disadvantages of the known prior art and to provide an improved sensor package, which effectively increases the accuracy of the sensor and provides a compact sensor design, in particular a sensor design where the sensing elements can be located very close to the magnetic field producing or influencing object.

SUMMARY

The aforementioned object is solved by the sensor package according to the independent claims of the current application.

A sensor package according to the invention may also be referred to as a sensor, or an inductive sensor. A sensor package in the sense of the current application is an assembly of elements of a sensor. The sensor package according to the invention comprises a non-conductive substrate, at least two sensing elements located at a first side of the non-conductive substrate, at least one non-sensing element located at the second side of the non-conductive substrate, which is opposing the first side of the non-conductive substrate, and conductive connections between the at least two sensing elements and the at least one non-sensing element.

Due to the arrangement of the sensing elements, the non-conductive substrate, and the non-sensing element, the accuracy of the sensor is increased because less elements of the sensor are exposed to the magnetic field. Hence, less eddy currents, which may reduce the accuracy of the sensing, are created. In particular, the at least two sensing elements are located at the first side of the non-conductive substrate while the at least one non-sensing element is located at the second side. Thereby, the at least two sensing elements do not need to be directly connected to the substrate, but only physically situated on the first side of the substrate. The at least one non-sensing element also does not need to be directly connected to the substrate, but only physically situated on the second side of the substrate. Hence, it can be said that the substrate is situated in between the at least two sensing elements and the at least one non-sensing element. Thereby, also one or several other layers in addition to the substrate may be situated in between the at least two sensing elements and the at least one non-sensing element. These other layers may also be incorporated in the substrate or may be situated on one side or both sides of the substrate. Hence also these layers may be situated in between the at least two sensing elements and the at least one non-sensing element. The layers may carry various further conductive and non-conductive structures. In alternative, the different layers may themselves be conductive or non-conductive, for example, to provide electrical connections between the elements of the sensor package or isolate them from one another.

The conductive connections between the at least two sensing elements and the at least one non-sensing element may only be partially located on the first side of the substrate to minimize their exposure to the magnetic field, such that less eddy currents are induced, which may impart the accuracy of the measurement. The conductive connections thereby can pass either directly from the at least two sensing elements to the at least one non-sensing element or can pass indirectly from the at least two sensing elements to the at least one non-sensing element. In case they pass indirectly from the at least two sensing elements to the at least one non-sensing element, the conductive connection may be formed by passing through further sensing or non-sensing elements, for example further active and/or passive electronic elements. The conductive connections may also be formed by different conductive layers or conductive structures located within the non-conductive substrate.

The non-conductive substrate is used as central basis at which the different sensor elements, i.e. the sensing elements as well as the non-sensing elements, are located. By using this non-conductive central basis, the generation of eddy currents is reduced. The term non-conductive substrate refers to the portion of the sensor package, which is used as basis for the package. The different elements, which are included in the sensor package, may be assembled on the non-conductive substrate. The substrate may be a solid substance, which is configured to incorporate or to support the different elements of the sensor package. The substrate is a non-conductive substrate, which means that it does not conduct electric currents. Preferably, glass-reinforced epoxy laminate sheets may be used as substrate material. Glass-reinforced epoxy laminate is a composite material comprising woven fiberglass and epoxy resin binder, which is flame resistant. However, also ceramics, silicon, silicon dioxide, aluminum oxide, sapphire, germanium, gallium arsenide, or an alloy of silicon and germanium may be used to form the substrate.

The non-conductive substrate comprises at least a first side and a second side, wherein the first side and the second side oppose each other. The sides of the substrate may define surfaces of the substrate. However, in accordance with the present invention, sides may not only refer to surfaces of the substrate which have a certain dimension defined by their length and width. The sides may also define volumes of the substrate, which have not only certain length and width, but also a certain thickness or height. The first side and the second side of the substrate may have the same thickness. However, it may be possible that the first side and the second side may have different thicknesses. The substrate may comprise a homogenous material or may comprise a layer structure, wherein the first side of the substrate may comprise at least one layer of the substrate and wherein the second side of the substrate may comprise at least one other layer of the substrate. The first side and the second side of the substrate may be in contact to one another or they may be separated by a layer, which neither belongs to the first side of the substrate nor to the second side of the substrate.

The sensor package according to the invention may be configured to be sensitive to magnetic fields. The electrically conductive coils are elements of the sensor package and may be referred to as the sensing elements. In particular, electrically conductive coils are inductive elements that are configured to generate or to receive a magnetic field. For example, a coil may be a wire, a wire in the shape of a coil, a wire in the shape of a spiral, or a wire in the shape of a helix, a loop, a multi turn loop, a solenoid, an inductor, or an array. A coil is electrically conductive, such that it is configured to conduct electric currents. The at least two electrically conductive coils may be arranged on the surface of the substrate, for example by printing, etching, soldering, or gluing the electrically conductive coils on the surface of the first side of the non-conductive substrate. However, it is also possible that the at least two electrically conductive coils are at least partially integrated into the first side of the substrate. The at least two electrically conductive coils may also be arranged at different heights on the first side of the substrate. For example, one of the at least two electrically conductive coils may be arranged at the surface of the first side of the substrate, whereas the other of the at least two electrically conductive coils may be arranged inside the first side of the substrate, hence at least partially beneath the other electrically conductive coil. As such, it is possible that the at least two electrically conductive coils may at least partially overlap each other. Furthermore, it may also be possible that at least a part of the at least two electrically conductive coils is arranged on the surface of the first side of the substrate, whereas the remaining part of the at least two electrically conductive coils is arranged inside the first side of the substrate. For example, the at least two electrically conductive coils may have a spiral shape with a certain height. The spiral may start at the surface of the substrate and may specially extend within the first side of the substrate. The surface of the substrate thereby does not necessarily refer to the upper most layer or element. In accordance with the present invention, there may be further means or layers on the surface of the substrate. For example, the surface may at least partially be coated with a protective layer. For example, if another conductor shall be located above the electrically conductive coils, at least the part of the coils where the conductor will cross the coils can be applied with a dielectric such that conductor crossovers are possible. Furthermore, on the top of the at least two electrically conductive coils, also a protective layer may be arranged, which entirely covers the electrically conductive coils.

At least one of the at least two electrically conductive coils may form a sensor element of the sensor package, which may be sensitive to a magnetic field. This means that at least one of the at least two electrically conductive coils may be configured to receive a magnetic field. Said at least one coil may also be referred to as a receiving coil. The magnetic field may be a vector field, denoted B, which may comprise the three components $B_x$, $B_y$, and $B_z$ in a three-dimensional Cartesian coordinate system. However, a person skilled in the art will recognize that also other components may be possible, which are only dependent on the definition of the coordinate system. When the at least one of the at least two electrically conductive coils receives a magnetic field, a current may be caused in said at least one coil as described by Faraday's law of induction. Further, the electric current may also be associated with a voltage, which may be sensed. The electric current may be referred to as an inductive current and the voltage may be referred to as an inductive voltage. Sensing the inductive current or the inductive voltage may comprise any of registering the inductive current and/or voltage, measuring the inductive current and/or voltage, and/or directing the inductive current and/or voltage to a means for registering or a means for measuring the inductive current and/or voltage. This inductive current or voltage may also be referred to as the direct sensed signal or the direct measured signal of the sensor. Further, the at least one receiving coil may be configured to communicate with the evaluation circuit. For example, said at least one coil may provide the inductive current or voltage or a signal indicative of the inductive current or voltage to the evaluation circuit. It may be possible that the evaluation circuit comprises a means for registering and/or a means for measuring the inductive current and/or voltage. The evaluation circuit may then process the inductive current and/or voltage and may produce an indirect measured signal of the sensor.

Further, at least one of the at least two electrically conductive coils may be configured to provide a magnetic field. Providing the magnetic field may also be referred to as producing, generating, or transmitting the magnetic field. Said at least one coil may therefore also be referred to as providing coil, producing coil, generating coil, or transmitting coil. Said at least one transmitting coil may provide the magnetic field as a response to an electric current, which may be applied to the transmitting coil and as such may flow through the transmitting coil. The electric current may cause a movement of electromagnetic charges. As known in the art, a movement of electromagnetic charges may cause the generation of a magnetic field. This effect may be denoted Ampere's circuital law. The strength of the magnetic field and as such the amount of magnetic flux produced is proportional to the amount of current provided to the coil. The electric current, which may be applied to said at least one transmitting coil, may be provided to said at least one transmitting coil by the evaluation circuit. However, it is also possible that the evaluation circuit controls the electric current or voltage provided to the at least one transmitting coil. Therefore, the transmitting coil may also be configured to communicate with the evaluation circuit. However, the electric current may also be directly provided to the transmitting coil.

Thus, the sensing element could be formed by an element, which generates or transmits the magnetic field, such as the transmitting coil, as well as by an element, which senses or measures the magnetic field, such as the receiving coil.

The at least one receiving coil may be configured to receive the magnetic field, which is provided by the at least one transmitting coil. The at least one receiving coil may as such be configured to couple inductively with the at least one transmitting coil. This inductive coupling may be a magnetic flux coupling. Thereby, the magnetic flux is a measurement of the total magnetic field which passes through a given surface. Hence, the magnetic flux is related to the number of magnetic field lines of the magnetic field, which pass through the given surface, i.e. the density of the magnetic field lines. The magnetic flux coupling may be influenced by a specific target upon which the magnetic field generated by the transmitting coil impinges and which affects the direction of the magnetic field lines of this magnetic field. The so affected magnetic field can then be measured by the receiving coil. Thereby, the form of the specific target may be constituted by a structure, which defines a preferred direction how the target influences the course of the magnetic field lines. Thereby, the shape or form of the target may influence the magnetic field lines to align in a preferred direction. Hence, if the at least one receiving coil lies within this preferred direction and as such the magnetic field lines generated by the at least one transmitting coil are aligned in the direction of the receiving coil, then the magnetic flux coupling between the at least one transmitting coil and the at least one receiving coil is the highest. This situation changes again, when the target is moved and as such the magnetic field is again affected differently, because the preferred direction has changed. Hence, the magnetic flux coupling between the at least one transmitting coil and the at least one receiving coil is different for different positions of the target. This knowledge allows to sense the position of the target based on the measurements taken by the at least one receiving coil.

The at least one transmitting coil and the at least one receiving coil may each be configured to change their operational mode from transmitting a magnetic field to receiving a magnetic field and vice versa. As such, the at least one transmitting coil may change its operational mode from generating a magnetic field to receiving a magnetic field and may therefore become one of the at least one receiving coils. Similarly, the at least one receiving coil may be configured to change its operational mode from receiving a magnetic field to generating a magnetic field and may therefore become one of the at least one transmitting coils. Furthermore, it is contemplated that the different coils may change their sensitivity and/or the strength of the magnetic field they produce.

Non-sensing elements, for example the evaluation circuit, may be located at the second side of the non-conductive substrate, which opposes the first side. Similar to the electrically conductive coils at the first side, the evaluation circuit may be arranged, for example, on the surface of the second side of the substrate or may be integrated at least partially into the second side of the substrate. Also here, the elements on the second side of the substrate may be covered with a protective layer, which may be complete or partially covering the second side and may allow conductor crossovers.

The evaluation circuit, which is located at the second side of the non-conductive substrate, may be a semiconductor device. The evaluation circuit may also be referred to as an integrated circuit or a die. The evaluation circuit may be connected by ease of conductive connections with at least one of the at least two electrically conductive coils. Further, the evaluation circuit may be configured to receive a signal indicative of the sensed magnetic field from the at least one receiving coil. Alternatively or additionally, the evaluation circuit may also be connected by ease of conductive connections with the other of the at least two electrically conductive coils. The evaluation circuit may thereby be configured to control the electric current or voltage provided to the at least one transmitting coil. The connections may be direct or indirect.

A signal received by the evaluation circuit from at least one of the at least two electrically conductive coils may be indicative of an induced current or voltage and/or a strength of a magnetic field, which is sensed by the sensor. For example, said signal may be a current or a voltage, wherein the current may be the inductive current and the voltage may be the inductive voltage. The evaluation circuit may use the received signal to evaluate the sensed magnetic field, wherein evaluating the sensed magnetic field may comprise processing the received signal. The evaluation circuit may report either the direct signal received from the receiving coil or a result of the processing to another entity, i.e. the indirect measured signal. As such, the reporting may comprise providing another entity with a result of the processing or directing or forwarding the received signal to another entity.

Also, the evaluation circuit may provide an electric current to at least one of the at least two electrically conductive coils, which may be referred to as transmitting coil, such that said transmitting coil provides a magnetic field. Alternatively or additionally, the evaluation circuit may control the electric current or voltage provided to the at least one transmitting coil. These processes of providing and/or controlling an electric current or voltage to the transmitting coil may also be referred to as driving the transmitting coil. The evaluation circuit may autonomously drive the transmitting coil, wherein the evaluation circuit may drive the transmitting coil continuously or in a pulsed manner. Also, the evaluation circuit may drive the transmitting coil with an alternating current in order to induce an alternating magnetic field.

Since the evaluation circuit may autonomously drive the at least one transmitting coil and may receive a signal from the at least one receiving coil, it may also be said that the evaluation circuit may operate the at least two electrically conductive coils. As such, operating the coils may comprise at least one of controlling a magnetic field, sensing a magnetic field, evaluating a magnetic field, and/or reporting results of a sensing or evaluating of a magnetic field.

The at least two electrically conductive coils and the evaluation circuit may be connected by ease of conductive connections. The conductive connections may comprise any type of connection, which is suitable to provide or receive an electric current or voltage or a signal. Preferably, the conductive connections may comprise wires in or on the non-conductive substrate, channels in the substrate which comprise wires, or circuit paths, like printed circuit board tracks. Thereby, the conductive connections may comprise a conductive material, such that they are configured to conduct electric currents. The connections may thereby be direct or indirect. The connections may also be formed by conductive layers within the substrate or by ease of other conductive structures within the substrate.

The conductive connections between the at least two electrically conductive coils and the evaluation circuit are configured to enable conveyance of a current or a voltage between the at least two electrically conductive coils and the evaluation circuit. The conveyed currents or voltages may also be referred to as signals. For example, the evaluation circuit may be configured to receive signals, for example in form of a voltage and/or a current, from at least one of the at least two electrically conductive coils. The evaluation circuit may however also be configured to drive at least one of the at least two electrically conductive coils, wherein driving a coil means that a voltage and/or a current is applied to said coil via the conductive connections. This applied voltage and/or a current may for example be a constant voltage and/or a current or an alternating voltage and/or a current.

The conductive connections between the at least two electrically conductive coils and the evaluation circuit may be incorporated in the substrate. For example, the conductive connections may penetrate the entire thickness of the substrate from the first side to the second side. Also, it may be possible that the substrate comprises at least one hole or channel, which penetrates the entire thickness of the substrate, such that the conductive connections may at least partially run through said at least one hole or channel. Furthermore, the substrate may also comprise conductive layers, which provide the conductive connections. The conductive connections are either formed by direct or indirect electrically conductive paths, i.e. either directly connecting the at least two coils with the evaluation circuit or via further active and/or passive elements.

In one embodiment of the sensor package according to the invention, the non-conductive substrate may comprise an electrically isolating, non-metallic, and/or low dielectric loss material. For example, the non-conductive substrate may comprise a plastic, glass, or ceramic material. Using at least one of these electrically isolating, non-metallic, and/or low dielectric loss materials further reduces eddy current generation in the sensor package according to the invention, since these materials are not or at least only little sensitive to magnetic fields. Therefore, none or at least only small eddy currents are generated in the material of the substrate itself. Furthermore, these materials act as shield to protect the evaluation circuit from the effect of the measured and/or produced magnetic field.

In one embodiment of the sensor package according to the invention, the non-conductive substrate may be configured to impart substantial structural rigidity. In the solution known from the prior art, structural rigidity may only be established by ease of a lead frame, which is used as the central basis. Since the substrate is used as central basis in the sensor package according to the invention, the substrate may be configured to provide at least some or all of the structural rigidity of the sensor package. Structural rigidity in the sense of the invention means that the substrate comprises a structure or form, which is stable with respect to the lifetime of the sensor package during any circumstance related to the intended use of the sensor. Structural rigidity may also be referred to as stability, persistency, and/or durability. However, structural rigidity may also be provided by a lead frame. Furthermore, structural rigidity can be achieved by molding or over-molding the sensor elements with a mold material.

In one embodiment of the sensor package according to the invention, the non-conductive substrate may comprise connection pads at the second side of the substrate for connecting the at least two electrically conductive coils with the evaluation circuit. The connection pads may be connected with the at least two electrically conductive coils located at the first side of the substrate and may be configured to be connected with the evaluation circuit located at the second side of the non-conductive substrate. For example, the connection pads may be bond pads or wire pads. The connection pads may be configured to be connected with the evaluation circuit by wire-bonding or by bump bonding, in case the evaluation circuit is located on the second side of the substrate as a flip chip. The connection pads either may be connected to the conductive connections between the at least two electrically conductive coils and the evaluation circuit, or may be part of said conductive connections. Further, the connection pads may be connected to the at least two electrically conductive coils by at least one wiring, which penetrates the non-conductive substrate. Alternatively, at least a portion of the connection pads may penetrate the non-conductive substrate, such that said portion of the connection pads may extend to the first side of the non-conductive substrate and may be connected to the at least two electrically conductive coils.

In one embodiment of the sensor package according to the invention, the evaluation circuit is mounted as flip chip onto the second side of the substrate. The substrate may therefore comprise respective connections, which allow the evaluation circuit to be connected to the conductive connections and as such to the at least two electrically conductive coils.

In one embodiment of the sensor package according to the invention, the at least two electrically conductive coils may be integrated at least partially into the non-conductive substrate at the first side of the non-conductive substrate. For example, the at least two electrically conductive coils may each comprise a volume, hence not only extending in lengths and width, spanning an area, but also having a height or thickness. At least one of the at least two electrically conductive coils may then be integrated at least partially into the non-conductive substrate such that for example a first portion of the volume of the coil is surrounded by the non-conductive substrate. According to one embodiment, at least a second portion of the volume of the coil is not surrounded by the non-conductive substrate. For example, the first portion may be located inside of the non-conductive substrate, while the second portion may be located on the surface of the non-conductive substrate. However, it may also be possible that the volume of at least one of the at least two electrically conductive coils may be integrated entirely into the substrate. In this case, the entire volume of said coil may be located inside of the non-conductive substrate, such that the entire volume of the coil may be located below the surface of the electrically non-conductive substrate. The at least two electrically conductive coils may also be integrated at different heights in the substrate.

In one embodiment of the sensor package according to the invention, the at least two electrically conductive coils may not structurally overlap each other. Thereby, said at least two coils may be adjacent to one another but may not structurally overlap each other. Structurally overlapping may also be referred to at least partially interleaving, interlacing, or intertwining. Consequently, the at least two coils are each localized in a particular volume of the substrate in such a way that no portion of the volume of a particular one of said at least two coils lies in the volume, which belongs to another one of said at least two coils. In detail, a first coil of the at least two coils may define a first continuous volume, which has no portion in common with a second continuous volume, which may be defined by a second coil of said at least two coils.

In one embodiment of the sensor package according to the invention, the at least two electrically conductive coils at least partially and structurally overlap. Thereby, the spatial extend of the at least two coils at least partially overlaps. For this overlap, the at least two coils may be implemented on different layers on or in the substrate. Hence, a plane in which at least one of the two coils is arranged may be spatially offset to a plane in which at least the other of the at least two coils is arranged. It can also be said that at least one of the two electrically conductive coils lies beneath the other of the at least two electrically conductive coils.

In one embodiment of the sensor package according to the invention, one of the at least two electrically conductive coils may provide a magnetic field and the other of the least two electrically conductive coils receives the magnetic field. Hence, the at least one receiving coil may couple to the at least one transmitting coil.

In one embodiment of the sensor package according to the invention, the sensor package may comprise at least three electrically conductive coils located at the first side of the non-conductive substrate. Thereby, the at least three electrically conductive coils may be configured to switch their operational mode from producing a magnetic field to receiving a magnetic field. Hence, in one configuration at least one of the three electrically conductive coils may produce a magnetic field whereas the other two receive the magnetic field. In another configuration two of the three electrically conductive coils may produce a magnetic field, whereas the other receives the superposition of the respective magnetic fields.

In one embodiment of the sensor package according to the invention, the sensor package may further comprise a lead frame, which may be arranged only at the second side of the substrate. The lead frame may be used for the assembly of the elements, which are located at the second side of the non-conductive substrate. For example, the evaluation circuit may be placed at least partially on the lead frame. However, it may also be possible that the evaluation circuit is placed directly on the non-conductive substrate and the lead frame only at least partially surrounds the evaluation circuit or that the lead frame is located next to the evaluation circuit. The evaluation circuit may be connected to the lead frame by wires. The lead frame could extend over the spatial extend of the substrate by 20%, 30%, 50% or 80% in one or two dimensional extends of the spatial extend of the substrate. The lead frame may provide additional structural rigidity to the substrate. Since the lead frame of this embodiment of the invention may only be located at the second side of the non-conductive substrate, generation of eddy currents in the lead frame may be reduced. Further, the lead frame may be located at a position at the second side, which is sufficiently distant from the at least two electrically conductive coils, such that the small eddy currents, which may be generated in the lead frame do not affect the induced current or voltage, which is indicative of the sensed magnetic field. As such, it may be said that the at least two electrically conductive coils may be shielded from undesired eddy currents, because the elements, in which eddy currents may be generated, are sufficiently distant from the location of the at least two electrically conductive coils.

In one embodiment of the sensor package according to the invention, the lead frame may be at least partially integrated into the substrate at the second side of the non-conductive substrate.

In one embodiment of the sensor package according to the invention, the evaluation circuit may be connected to the lead frame by wire bonds or may be mounted as flip chip onto the lead frame or may be connected to the lead frame via the substrate.

In one embodiment of the sensor package according to the invention, the at least two electrically conductive coils at the first side of the non-conductive substrate may define a first area and the evaluation circuit may be located at the second side of the non-conductive substrate within a second area, which directly opposes the first area. Thereby, the two areas may have the same size. A person skilled in the art will recognize that the die does not need to fill the whole second area, but can be located within the second area at the second side of the substrate. Because the assembly of the elements on the non-conductive substrate reliably reduces eddy currents, it is possible to assemble the at least two electrically inductive coils and the evaluation circuit in areas of the first and the second side, respectively, which are directly opposing each other.

In one embodiment of the sensor package according to the invention, the sensor package comprises at least one terminal, wherein the at least one terminal is one of a supply terminal, an input terminal and an output terminal, wherein the at least one terminal may be connected to the evaluation circuit and/or to at least one of the at least two electrically conductive coils. The at least one terminal and the substrate may be soldered or glued. Further, it may also be possible that said at least one terminal may be soldered or glued to a lead frame, which may be located at the second side of the non-conductive substrate. The at least one terminal may be configured to connect the sensor to an entity, which uses the sensor. Therefore, the at least one terminal may be connected to a printed circuit board of the entity. The at least one terminal may be configured to enable communicating between the sensor and the entity. For example, the sensor package may receive a supply voltage, which may provide a power for the operation of the sensor, via one terminal. Additionally, the sensor may receive input information, which may be configured to control the sensor, via an input terminal. Input information may, for example, comprise information indicating that the sensor may start or stop its operation of sensing a magnetic field. Further, the input information may also be a command input, an internal or external test input, or an error signal. The evaluating circuit may provide output signals, which may be indicative of the sensed magnetic field, to the device via an output terminal. Thereby, the output signals may comprise raw data, i.e. the direct signal from the coils, or processed data, i.e. the indirect signal, namely the result of the processed direct signal, wherein the raw data or the processed data may be indicative of the sensed magnetic field or the sensed inductive current or voltage. It is also conceivable that the processed data comprises position information regarding a target which moves in close vicinity to the sensor and may affect the magnetic flux coupling. Raw data may, for example, comprise the inductive current or voltage, which may be sensed by at least one of the at least two electrically conductive coils. Processed data may comprise information about the sensed magnetic field, which may be related to the inductive current or voltage. The processed data may be a current or voltage provided or controlled by the evaluation circuit. Even so here only one configuration of terminals is described, it is clear to a person skilled in the art that also other configurations are encompassed. For example, two terminals may be configured to be supply terminals, e.g. for VDD and GND, and another terminal may be a combined input/output terminal. However, also other configurations and numbers of terminals are possible.

In one embodiment of the sensor package according to the invention, the sensor package may comprise at least one passive component. A passive component may also be referred to as passive element, additional element, or additional component and may be any one of blocking capacities, and/or resistors for an evaluation circuit supply system, capacitors for electromagnetic compatibility (EMC) emission, and/or passive inductors. The passive components may be mounted on a lead frame or may be mounted on the non-conductive substrate. The passive components may for example be glued or soldered to the lead frame or to the non-conductive substrate, respectively. Alternatively, the passive components may be distributed elements realized within the non-conductive substrate. For example, the non-conductive substrate may comprise a circuitry, which may be printed onto the non-conductive substrate, and portions of the circuitry may be configured to form passive components.

In one embodiment of the sensor package according to the invention, the sensor package may be encapsulated at least partially by a mold material. Encapsulating the sensor package by a mold material may protect the components of the sensor package from its environment. For example, the mold material may provide protection from corrosion and/or from physical damage, such as impact. The mold material may be a non-conductive mold material, for example, epoxy based molding compounds or polyphenylene sulfide (PPS).

In one embodiment of the sensor package according to the invention, the non-conductive substrate may comprise a redistribution layer. Thereby, a redistribution layer is a portion of the non-conductive substrate, which may be configured to route the conductive connections between the evaluation circuit and the lead frame. As such, the conductive connections may at least partially be located at the redistribution layer. Thereby, the conductive connections may be on the surface of the redistribution, may at least partially be located inside the redistribution layer, and/or may penetrate the redistribution layer.

In one embodiment of the sensor package according to the invention, the dimensions of the package depend on the internal elements and the capabilities of the substrate material. For example, the print of the substrate, which refers to the volume of the non-conductive substrate, may be larger than the evaluation circuit. The dimensions of the package may for example be 5–10×5–10 mm². In one embodiment, the package may have a size of 6×9 mm² or 6×6.5 mm². The evaluation circuit may have a size of 1 mm², 10 mm², or 20 mm². In a preferred embodiment, the at least two coils may have dimensions similar to the dimensions of the package, wherein the dimensions of the coils are 1 mm smaller in each direction in order to ensure that the coils may be fully molded by mold material.

BRIEF DESCRIPTION OF THE DRAWINGS

The following description and the annexed drawings set forth in detail certain illustrative aspects of the sensor package described above. These aspects are indicative, however, of a few of the various ways in which the principles of various embodiments can be employed and the described embodiments are intended to include all such aspects and their equivalent.

In the drawings, like reference characters generally refer to the same parts throughout the different drawings. The drawings are not necessarily to scale, emphasis instead generally being placed upon illustrating the principles of the invention.

Figure 1A:
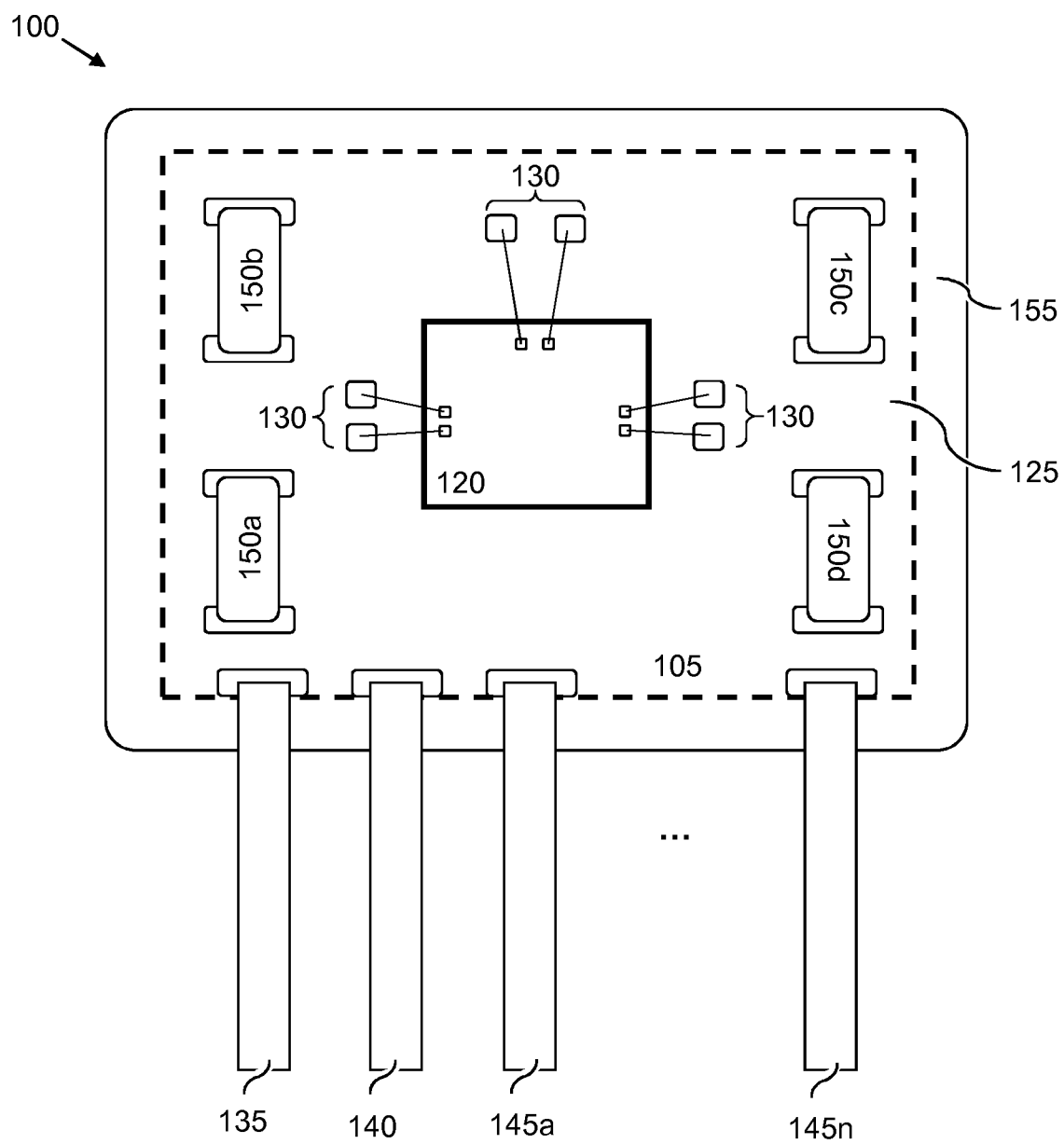
Figure 1B:
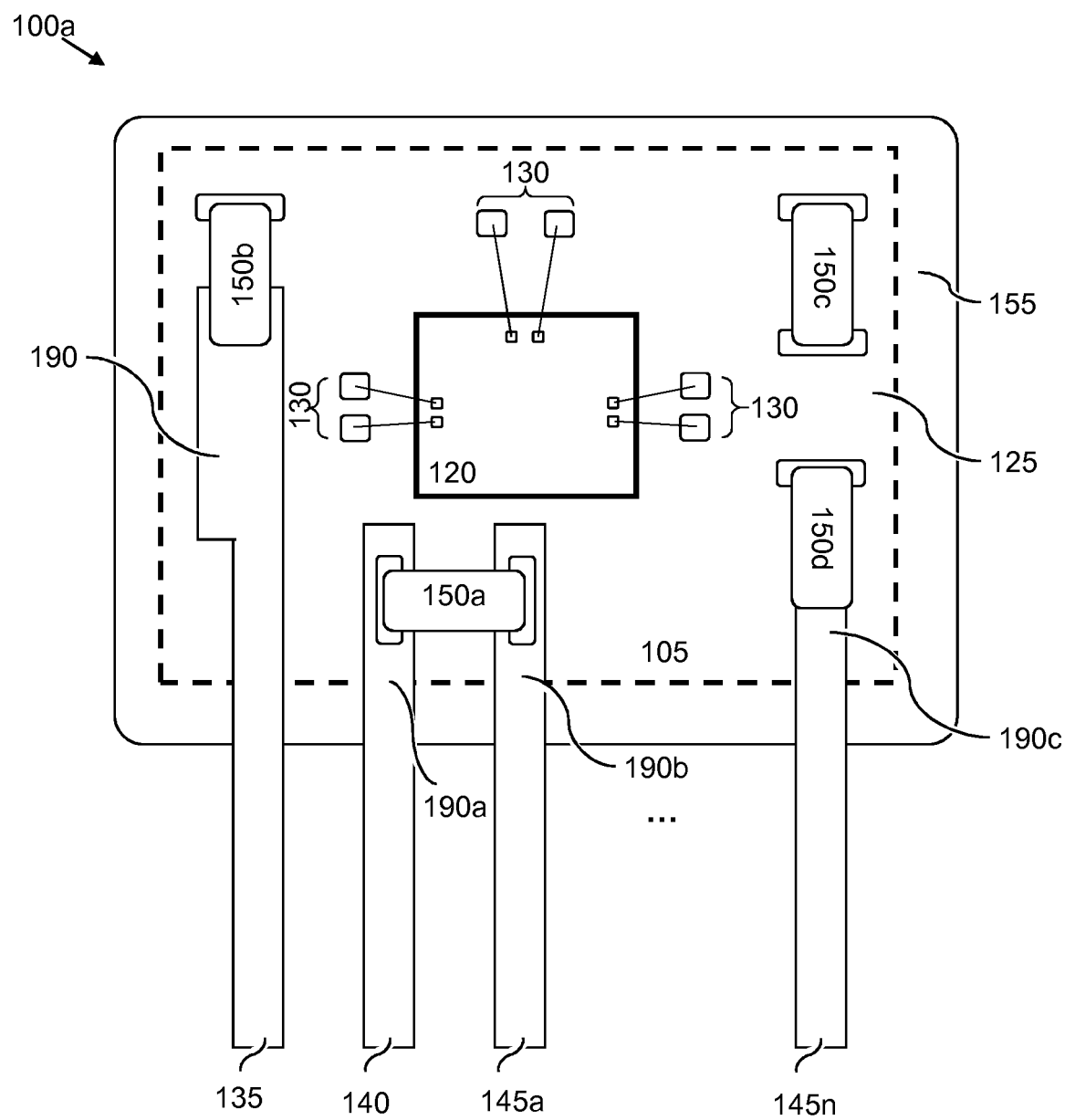
Figure 2:
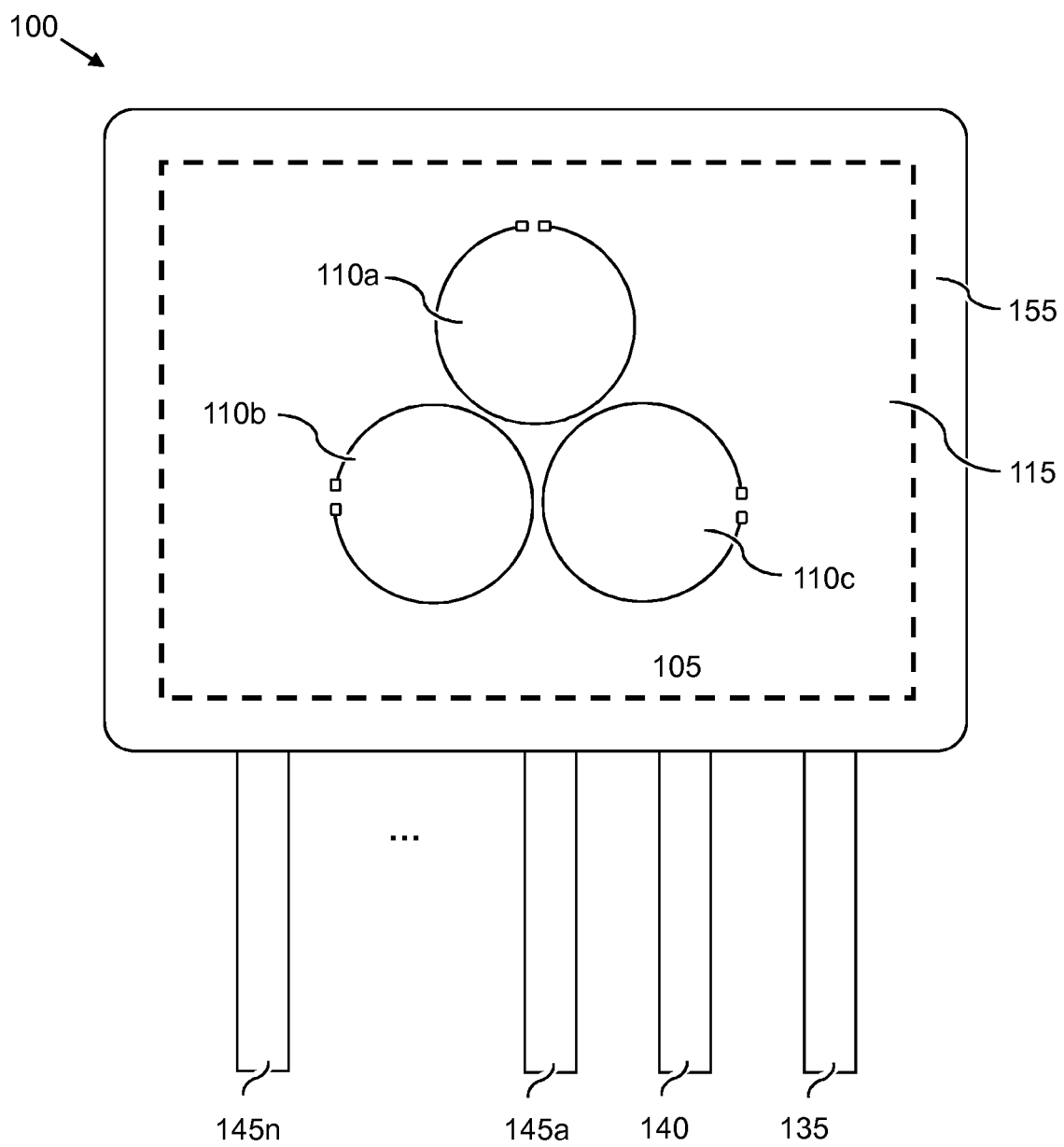
Figure 3A:
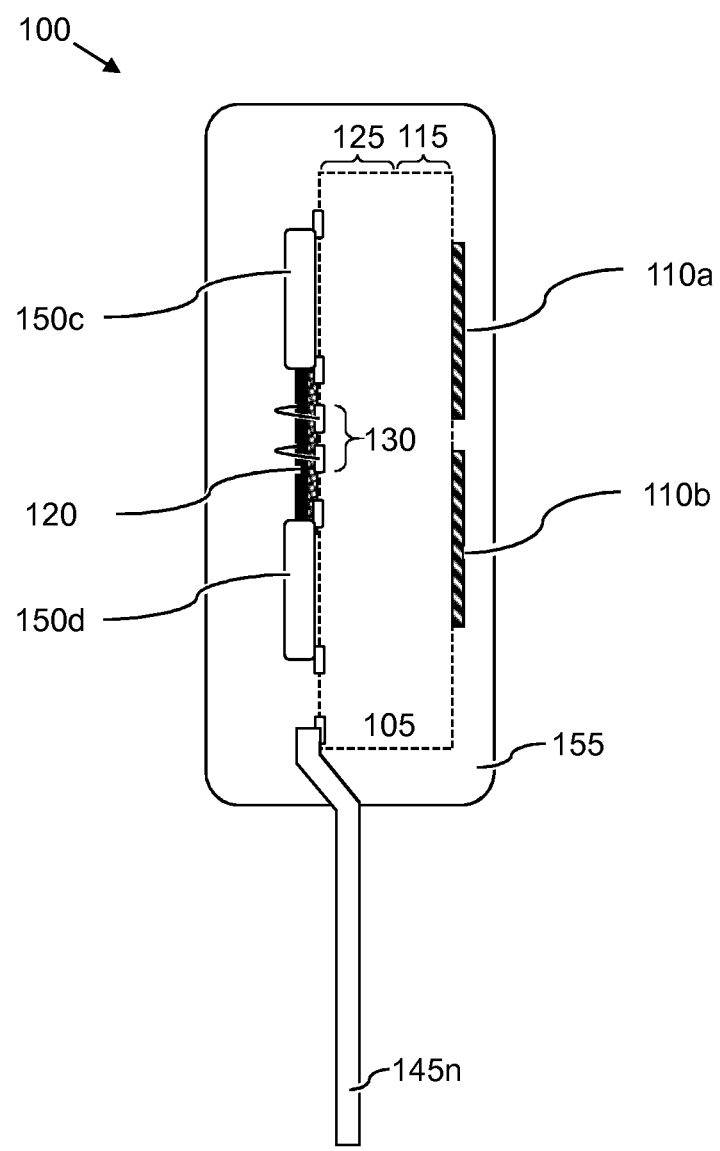
Figure 3B:
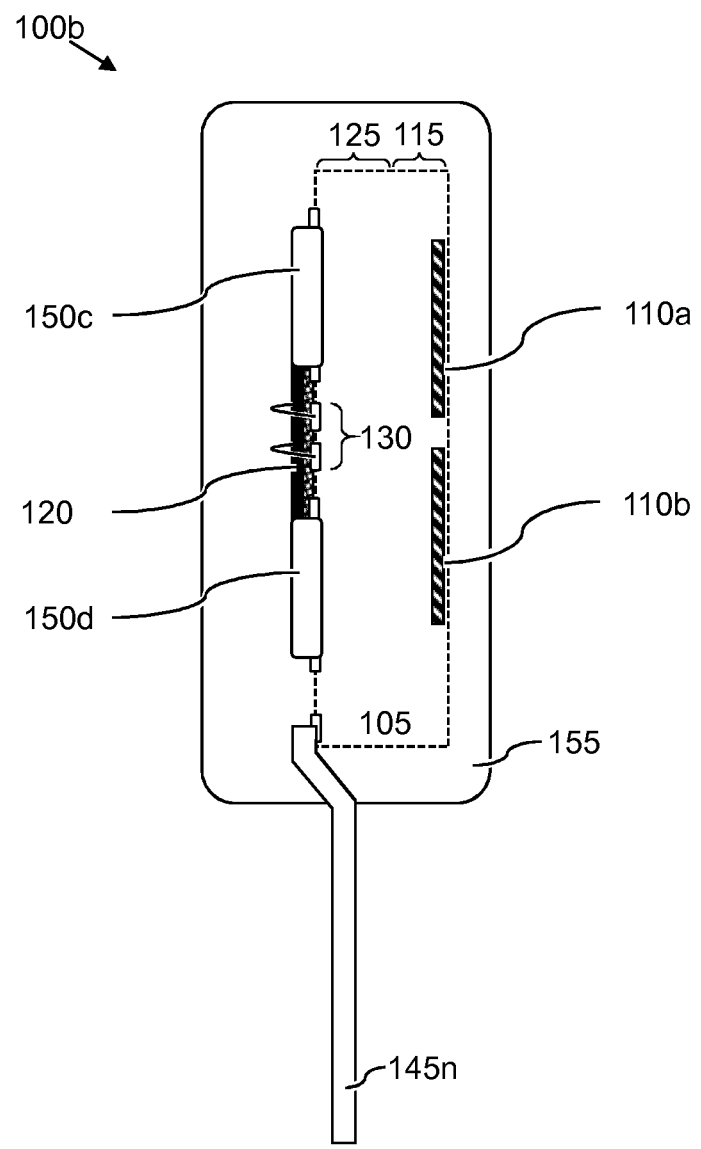

In the following description, various embodiments of the invention are described with reference to the following drawings, in which:

FIG. 1a, 1b show plan views of a sensor package according to embodiment examples of the invention, wherein the plan view is a plan view of the surface of the second side of the substrate;

FIG. 2 shows a plan view of a sensor package according to one embodiment example of the invention, wherein the plan view is a plan view of the surface of the first side of the substrate;

FIG. 3a, 3b show side views of a sensor package according to embodiment examples of the invention.

Figure 4A:
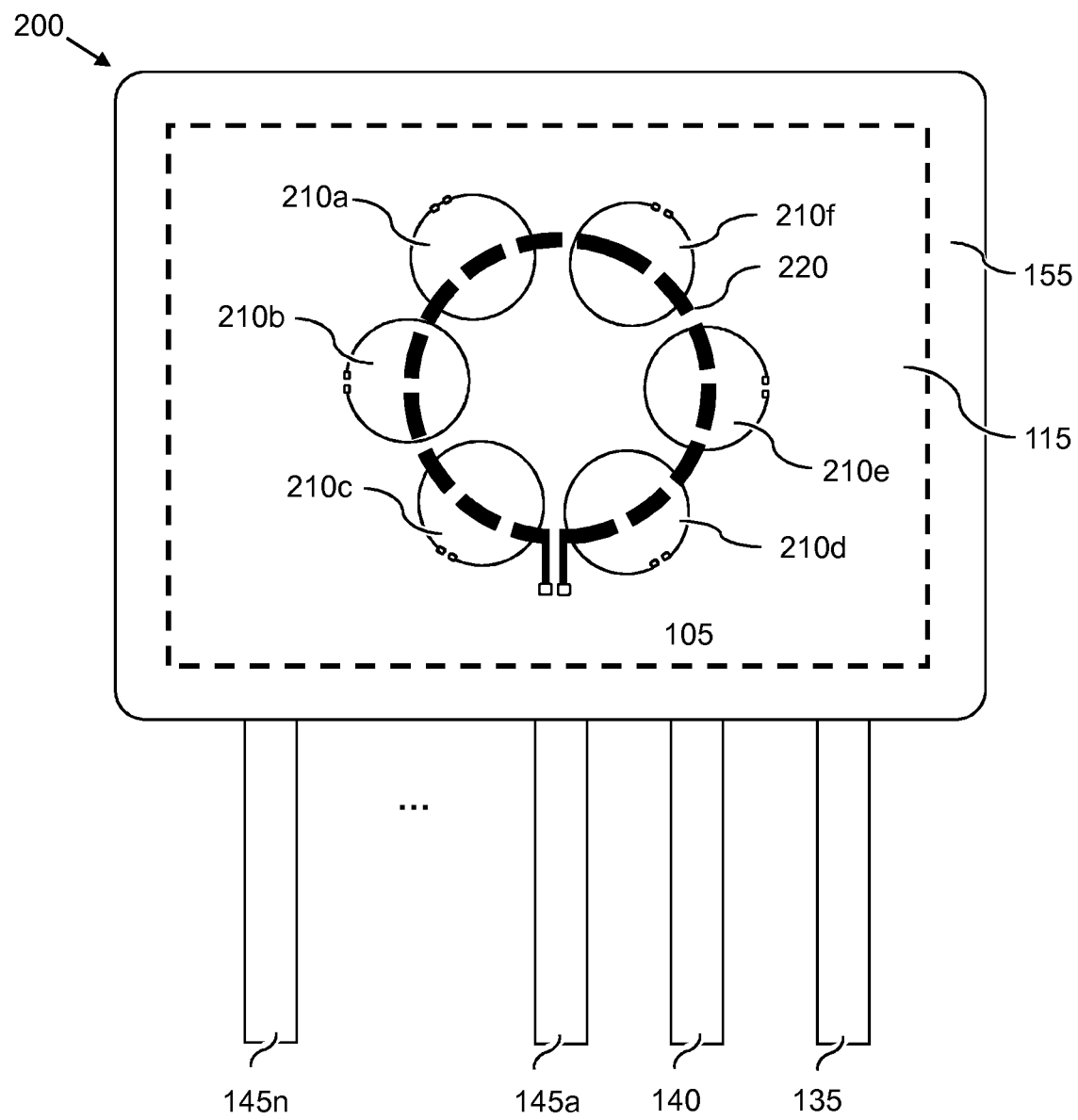

FIG. 4a shows a plan view of a sensor package according to an embodiment example of the invention, wherein the plan view is a plan view of the surface of the first side of the substrate.

Figure 4B:
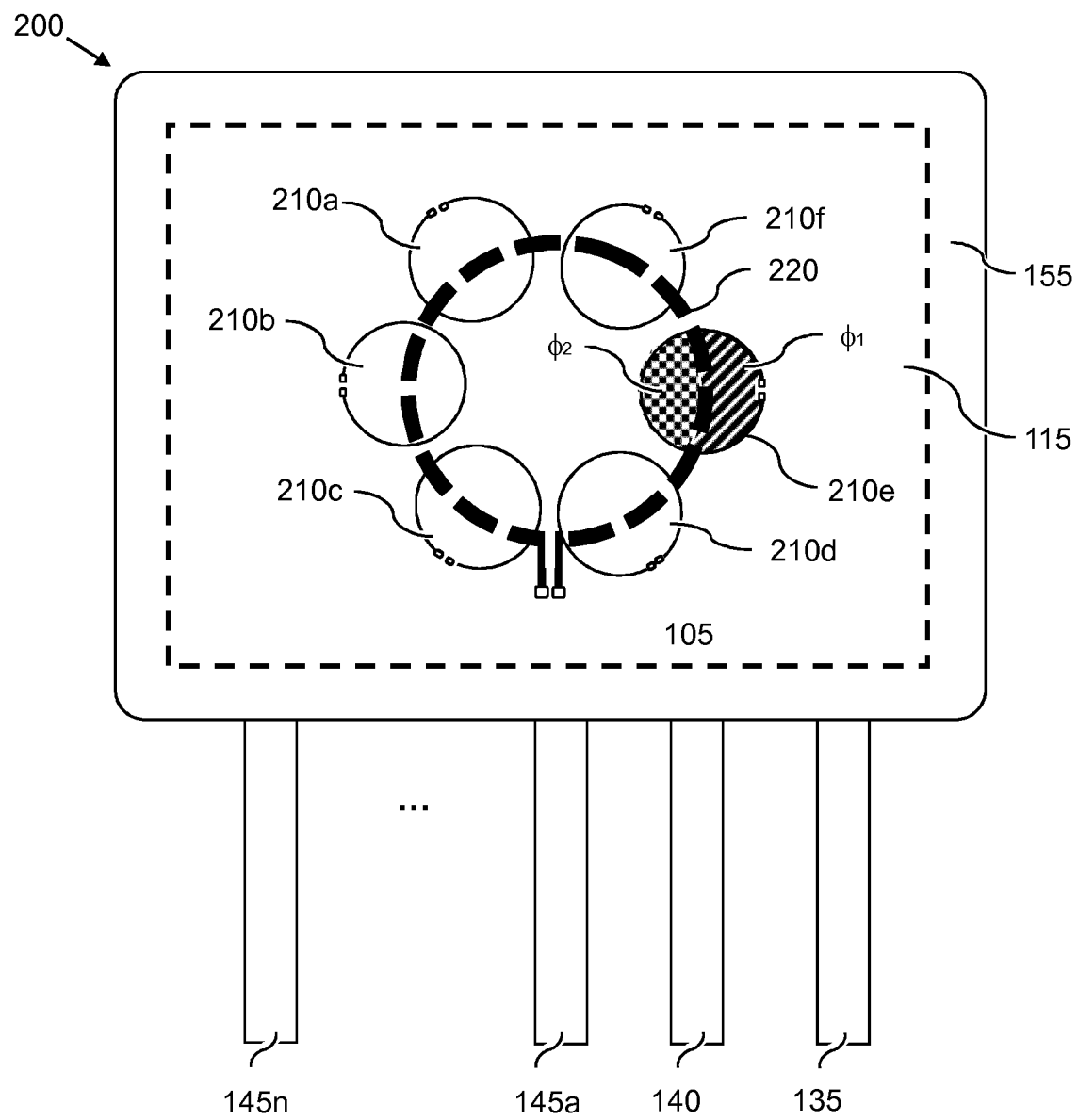

FIG. 4b shows an illustration of the magnetic flux for the sensor arrangement of FIG. 4a.

FIGS. 5 to 8 show plan views of a sensor package according to embodiment examples of the invention, wherein the plan view is a plan view of the surface of the first side of the substrate.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

FIG. 1a shows a plan view of a sensor package 100 according to one embodiment example of the invention. In detail, FIG. 1a shows a plan view of the surface of the second side 125 of the non-conductive substrate 105. The non-conductive substrate 105 is configured to support, at its second side 125, a number of elements, for example an evaluation circuit 120. Thereby, the evaluation circuit 120 and/or the further elements may be directly mounted on the substrate 105 or may only be physically situated on the second side 125 of the substrate 105, but not being in direct contact with the substrate 105. For example, a protective layer may be arranged in between the evaluation circuit 120, the further elements and the substrate 105. Further, the evaluation circuit 120 and/or the further elements may also be entirely or at least partially be integrated into the second side 125 of the substrate 105.

The evaluation circuit 120 may also be referred to as integrated circuit or die. The evaluation circuit 120 may be a semiconductor device. In the embodiment example shown here, the evaluation circuit 120 is located at the second side 125 of the non-conductive substrate 105 and is mounted onto the non-conductive substrate 105. As such, the elements, which are located at the second side 125 of the non-conductive substrate 105, for example the evaluation circuit 120, may be located on the surface of the non-conductive substrate 105 at the second side 125 or may at least partially be integrated into the volume of the non-conductive substrate 105.

The second side 125 of the non-conductive substrate 105 may also comprise connection pads 130, which are connected to the evaluation circuit 120. In the embodiment example shown in FIG. 1a, the evaluation circuit 120 is connected to the connection pads 130 by ease of wires. Further, the connection pads 130 are configured to be connected to at least two electrically conductive coils, which are located at the first side 115 of the non-conductive substrate 105 and are described in more detail below with respect to FIG. 2. The connection pads 130 may be connected to the at least two electrically conductive coils 110a-c as shown in FIG. 2 by ease of a connection, which penetrates the non-conductive substrate 105. For example, at least a connection portion of the connection pads 130 may extend through the non-conductive substrate 105 to the first side 115 of the non-conductive substrate 105. At the first side 115 of the non-conductive substrate 105, the connection portion of the connection pads 130 may be connected to the at least two electrically conductive coils 110a-c. In another example, the non-conductive substrate 105 may comprise at least one channel, which is configured to connect the first side 115 and the second side 125 of the non-conductive substrate 105. Thereby, the at least one channel may comprise at least one electrically conductive connection, for example a wire, which is configured to connect the at least two electrically conductive coils 110a-c and the bonding pads 130. However, it is also possible that at least one wire, which is configured to connect the bonding pads 130 and the at least two electrically conductive coils 110a-c, passes through the non-conductive substrate 105 without a particular channel in the non-conductive substrate 105. Furthermore, it is also possible that the substrate 105 itself comprises conductive layers or other conductive structures, which allow a conductive connection between the evaluation circuit 120 and the at least two electrically conductive coils 110a-c.

Further, the sensor package 100 shown in FIG. 1a comprises as further elements passive components 150a-d. These passive components 150a-d may also be referred to as passive elements, additional elements, or additional components and may comprise blocking capacities and resistors for a supply system of the evaluation circuit 120, capacitors for electromagnetic compatibility (EMC) emission, and/or passive inductors. In the embodiment example shown here, the passive components 150a-d are mounted onto the non-conductive substrate 105. The passive components 150a-d may be soldered or glued onto the non-conductive substrate 105. Although not shown here, the passive components 150a-d may be at least partially mounted onto a lead frame, in the case that the second side 125 may comprise a lead frame. In FIG. 1a, each passive component 150a-d is depicted as a discrete element, i.e. localized element, which is mounted on the non-conductive substrate 105 as a coherent element, as indicated by blocks 150a-d. However, it is also possible that the passive components 150a-d are distributed elements realized within the non-conductive substrate 105. For example, the non-conductive substrate 105 may comprise a circuitry and portions of the circuitry may be configured to form passive components 150a-d. Such a circuitry may be printed or etched onto the non-conductive substrate 105.

Also, the sensor package 100 shown in FIG. 1a comprises a number of terminals 135, 140, 145a-n, in particular at least one supply terminal 135, at least one input terminal 140, and a number of output terminals 145a-n. The person skilled in the art will understand that even so here a concrete number of terminals is shown, any suitable number of terminals may be implemented. The terminals 135, 140, 145a-n may be configured to connect the sensor to an entity, i.e. a device, which is using the sensor (not shown here). For example, the terminals 135, 140, 145a-n may be configured to connect the sensor with a printed circuit board. Further, the terminals 135, 140, 145a-n may be configured to provide information obtained by the sensor package 100 to its environment, for example to a device, which is using the sensor.

The supply terminal 135 may be configured to provide a supply voltage to the sensor package 100. As such, the supply voltage may enable the operation of the sensor package 100. The input terminal 140 may be configured to provide input signals to the sensor package 100. An input signal may, for example, be a current or a voltage, which may be used for controlling the sensor. For example, the input signal may instruct the sensor to start or complete its operation, for example, by starting or completing a process of sensing of a magnetic field. The output terminals 145a-n may be configured to communicate data from the sensor package 100 to at least one other device. The sensor package 100 may comprise any number of output terminals 145a-n, which is suitable to communicate with at least one other device. For example, at least one output terminal may be connected to the evaluation circuit 120, for providing output data of the sensor package 100. The output data may, for example, comprise a result of a sensing of a magnetic field. However, the output data may alternatively or additionally comprise the unprocessed data of said sensing. This unprocessed data may also be referred to as raw data and may, for example, be an inductive current or voltage, which is sensed by at least one of the at least two coils.

The sensor package 100 as depicted in FIG. 1a is also encapsulated with a mold material 155. The mold material protects the sensor package 100 from its environment. For example, the mold material may be configured to protect the sensor package 100 from corrosion and/or physical damage, like for example impact. Further, the mold material 155 may shield the sensor package from its environment. The mold material may be a non-conductive mold material, for example, epoxy based molding compounds or polyphenylene sulfide (PPS).

Although in FIG. 1a, the elements of the sensor package 100, which are located at the second side 125 of the non-conductive substrate 105, are mounted onto the non-conductive substrate 105, it is also possible that the second side of the non-conductive substrate 105 may comprise a lead frame. FIG. 1b depicts a sensor package 100a with such a lead frame 190 onto which the further elements 150a-d may at least partially be mounted. The lead frame 190 may, however, comprise a minimal size and cover only small portions of the non-conductive substrate 105, in order to prevent the generation of eddy currents. In the embodiment example shown in FIG. 1b, the lead frame 190 may comprise multiple parts 190, 190a-c. The lead frame 190 may also be at least partially be integrated into the substrate 105. Furthermore, even not shown here, the lead frame 190 may also be connected to the evaluation circuit 120 or the evaluation circuit 120 may at least be partially mounted on the lead frame 190.

FIG. 2 shows a plan view of the sensor package 100 according to one embodiment example of the invention, as already depicted in FIG. 1a. In detail, FIG. 2 shows a plan view of the surface of the first side 115 of the non-conductive substrate 105. The sensor package 100 according to the embodiment example comprises three electrically conductive coils 110a-c, which are located at the first side 115 of the non-conductive substrate 105. The three electrically conductive coils 110a-c may, for example, be printed, etched, soldered, or glued onto the substrate 105. Thereby, the three electrically conductive coils 110a-c may be located on the surface of the non-conductive substrate 105 or may be at least partially integrated in the non-conductive substrate 105. If the three electrically conductive coils 110a-c are at least partially integrated into the non-conductive substrate 105, it may also be possible that at least one of the three electrically conductive coils 110a-c is integrated in the non-conductive substrate 105 entirely, whereas the others may be arranged on the surface of the substrate 105. However, it may also be that all of the three electrically conductive coils 110a-c are integrated or buried into the substrate. The electrically conductive coils 100a-c may also be located all or at least partially in different heights at the first side 115 of the substrate 105. For example, at least two of the three coils 110a-c may be integrated into the substrate 105, whereas one of the at least three coils 110a-c is located at the first side 115 of the substrate 105. However, a person skilled in the art will also recognize that a different localization of the coils 110a-c is possible. Furthermore, the three coils 110a-c may be coated with a coating material. The here shown three electrically conductive coils 110a-c are represented exemplarily by a single loop, but the person skilled in the art will recognize that also other configurations are possible. Furthermore, it is also clear to a person skilled in the art that other numbers or arrangements of the electrically conductive coils are possible without deviating from the scope of the invention.

The at least three electrically conductive coils 110a-c of the sensor package 100 as shown in FIG. 2 may comprise at least one coil, e.g. coil 110a, which generates a magnetic field. Said at least one coil 110a may also be referred to as providing coil, producing coil, generating coil, or transmitting coil. Further, the remaining electrically conductive coils 110b and 110c may receive the magnetic field. Said coils 110b and 110c may also be referred to as receiving coils.

The receiving coils 110b and 110c may be configured to receive the magnetic field, which is provided by the transmitting coil 110a. Upon reception, said magnetic field may induce an inductive current or voltage in the receiving coils 110b and 110c. It may be said that the receiving coils 110b and 110c may couple to the at least one transmitting coil 110a. This coupling may be referred to as inductive coupling and may be affected by a target (now shown here), which is configured to move in the vicinity of the coils 110a-c. It is thereby clear to a person skilled in the art that the magnetic field generated by at least one transmitting coil 110a comprises a gradient in the magnetic flux, which causes eddy currents to flow within the target. These eddy currents in the target the affect the magnetic field generated by the transmitting coil 110a and as such the magnetic flux coupling between the at least one transmitting coil 110a and the receiving coils 110b. If more than one transmitting coil is used, the magnetic field is constituted by the superposition of the at least two magnetic fields produced. In order to also in this case encounter a gradient in the magnetic field, either the magnetic fluxes of the generated magnetic fields can be different and/or the direction of the generated magnetic fields can be different. In general, it can be said that the magnetic flux of the impinging magnetic field at the target generates eddy currents that will flow along discrete paths defined by structures of the target. Thereby, some of these eddy currents may cancel out each other, whereas others will be strengthened dependent upon the difference in geometry of the structures and/or the difference in magnetic fluxes impinging on the target. For example, if the target has got structures with the same inductance, the impinging magnetic field needs to exhibit a gradient, in order that the partially and/or purely induced eddy currents are not cancelled out, whereas if the target has got structures with difference in inductance between adjacent structures, the magnetic field does not need to exhibit a magnetic gradient. As such, with the geometry of the structures and therefore the shape or form of the target, it can be accounted for different impinging magnetic field situations. This can be exploited, for example in order to increase the eddy currents along the preferred direction of the target. Hence, in turn increase the magnetic field produced by the eddy currents and as such increase the effect of the target. It can be said that the target may influence the magnetic flux coupling between the transmitting coil 110a and each of the receiving coils 110b and 110c. As such, the target may be configured to influence the direction of the magnetic field lines of the magnetic field, for example by causing an alignment of the magnetic field lines with a particular direction, wherein the particular direction is derivable from the form of the target. Depending on the position of the target relatively to the at least two receiving coils 110b and 110c, the particular direction with which the magnetic field lines are aligned, may be different. Consequently, the magnetic flux and the magnetic field, which may be sensed by the at least two receiving coils 110b and 110c may depend on the position of the target. The sensed magnetic field may, therefore, be indicative of a position of the target or a change in the position of the target, for example caused by a movement, which may be a rotational or a linear movement. In order to facilitate the alignment of the magnetic field lines, the target may comprise a conductive material. Since the sensor package 100 may only comprise the sensing elements at the first side 115 of the non-conductive substrate 105, the sensing elements, i.e. the three coils 110a-c, may be placed in short distance to the target, which improves the alignment of the magnetic field lines. The sensor package 100 may also comprise means for storing expected current or voltage values for specific targets. These values may be stored during a calibration run with a specific target or may be modelled results. By ease of a comparison between these expected values and the values actually measured by the at least two receiving coils 110b and 110c, the position of the target can be determined. This comparison may for example be performed by the evaluation circuit 120, which then as output may provide the position of the target.

However, the at least one transmitting coil 110a and the receiving coils 110a-c of the sensor package according to the invention may also be configured for magnetic flux coupling. In the case of magnetic flux coupling, the coupling does not primarily dependent on the magnitude of the magnetic field but on the direction and/or the density of the magnetic field lines of the magnetic field. This coupling may then be referred to as magnetic flux coupling, because a change in the direction and/or the density of the magnetic field lines changes the magnetic flux of the respective region, which undergoes a change in the direction and/or the density of the magnetic field lines.

The electrically conductive coils 110a-c may also be configured to change their operational mode during operation. For example, one electrically conductive coil in one time instance may be a transmitting coil and in another time instance may be a receiving coil. Hence, different configurations are possible with the three electrically conductive coils 110a-c as depicted in FIG. 2. For example, two electrically conductive coils 110a and 110b each may produce a magnetic field, whereas the electrically conductive coil 110c may receive the superposition of the respective produced magnetic field, for example, both influenced by a target (not shown here). In another time instance the configuration may change and the respective named coils may take on a different operational mode. Thereby, the electrically conductive coils 110a-c may individually and dynamically change their operational mode from receiving a magnetic field to producing a magnetic field, such that a magnetic flux coupling can be sensed from different positions to enhance position determination capability of the sensor package 100. This change in operational mode will be described below in more detail.

Further, FIG. 2 shows the back view of the terminals 135, 140, 145a-n and the mold material 155, which encapsulates the sensor package 100, as already depicted in FIG. 1a.

FIG. 3a shows a side view of a sensor package 100 according to the embodiment example of the invention, as already depicted in FIGS. 1 and 2. The non-conductive substrate 105 comprises a first side 115 and a second side 125. In this example, each of the first side 115 and the second side 125 of the non-conductive substrate 105 comprises a thickness, which is depicted by ease of the bracket next to the reference signs 115, 125 in FIG. 3a. As depicted in FIG. 3a, the thickness of the first side 115 and the thickness of the second side 125 may be equal. However, it is also possible that the first side 115 and the second side 125 have different thicknesses. For example, the first side 115 may be limited to only the surface of the substrate 105 or may be limited to a thin layer of the substrate 105, while the second side 125 may be substantially thicker than the first side 115. However, in another example, the first side 115 may be substantially thicker than the second side 125. Both sides 115, 125 oppose each other. Thereby, the first side 115 and the second side 125 may have contact to each other or may be separated by at least one layer, which is neither part of the first side 115 nor of the second side 125. Even so the different sides 115 and 125 are in the here shown embodiment example depicted as solid block, the sides 115 and 125 may also comprise a layer structure. The layer structure may comprise non-conductive and conductive layers. Wherein the conductive layers may act as conductive connections for the sensor elements.

The first side 115 and the second side 125 of the non-conductive substrate 105 may be formed by layers of substrate material. For example, the non-conductive substrate 105 may comprise at least two layers, wherein the first side 115 comprises at least a first layer of the non-conductive substrate 105 and the second side 125 comprises at least a second layer of the non-conductive substrate 105.

In the case that the non-conductive substrate 105 comprises layers, the non-conductive substrate 105 may comprise a redistribution layer. The redistribution layer may be configured to route the conductive connection between the three electrically conductive coils 110a-c and the evaluation circuit 120. Thereby, the redistribution layer may divide the non-conductive substrate 105 in at least two portions, which may be equal to the first side 115 and the second side 125 of the non-conductive substrate 105. The redistribution layer may be a part of the first side 115 of the non-conductive substrate 105, may be a part of the second side 125 of the non-conductive substrate 105, or may not be part of any of the first side 115 and the second side 125 of the non-conductive substrate 105.

As depicted in FIG. 3a, the first side 115 of the non-conductive substrate 105 may comprise the three electrically conductive coils 110a-c. The three electrically conductive coils 110a-c may be located at the first side 115 of the non-conductive substrate 105 in such a way that they are arranged on the surface of the first side 115 of the non-conductive substrate 105. As such, the three electronically conductive coils 110a-c may be mounted onto the non-conductive substrate 105, may be attached to the non-conductive substrate 105, or may be printed, etched, or soldered on the non-conductive substrate 105. Further, at least one of the at least three electrically conductive coils 110a-c may be coated with a protective layer.

At the second side of the non-conductive substrate 105, the evaluation circuit 120 is located. The evaluation circuit 120 may be arranged on the surface of the non-conductive substrate 105. In order to achieve this, the evaluation circuit 120 may for example be mounted onto the non-conductive substrate 105 or may be attached to the non-conductive substrate 105.

The second side 125 of the non-conductive substrate 105 may also comprise further elements, like passive components 150a-d, connection pads 130, and terminals 135, 140, 145a-c. Similar as the three electronically conductive coils 110a-c and the evaluation circuit 120, these elements may be located at the second side 125 of the non-conductive substrate 105. Additionally, the terminals 135, 140, 145a-n may emerge from the second side 125 of the non-conductive substrate 105, in order to be connected with another device.

FIG. 3b shows a side view of a sensor package 100 according to the embodiment example of the invention, as already depicted in FIGS. 1 and 2. In the here shown embodiment example, the electrically conductive coils 110a-c are integrated into the substrate 105 on the first side 115 and the further elements 150a-d are at least partially integrated into the substrate 105 on the second side 125. Additionally, the terminals 135, 140, 145a-n may emerge from the second side 125 of the non-conductive substrate 105, in order to be connected with another device.

In both embodiment examples depicted in FIGS. 3a and 3b, the three electrically conductive coils 110a-c are the only conductive elements, which are located at the first side 115 of the non-conductive substrate 105. All further conductive elements, i.e. the non-sensing elements, of the sensor package are be located at the second side 125 of the non-conductive substrate 105. Furthermore, even if the embodiment example as shown in FIG. 3a regards elements arranged on the surface of the substrate, whereas the embodiment example shown in FIG. 3b regards elements at least partially integrated into the substrate 105, it is clear to a person skilled in the art that also a mixture of the two embodiment examples is covered by the scope of the current invention. Hence, some elements may be partially or completely integrated into the substrate 105, whereas others are arranged on the surface of the substrate 105 on the respective side 115, 125 of the substrate 105.

FIGS. 4 to 8 show further embodiment examples of the sensor package according to the invention with different sensing element arrangements.

FIG. 4a shows a plan view of the sensor package 200 according to one embodiment example of the invention. In detail, FIG. 4a shows a plan view of the surface of the first side 115 of the non-conductive substrate 105. The sensor package 200 according to the embodiment example comprises seven electrically conductive coils 210a-f, 220, which are located at the first side 115 of the non-conductive substrate 105. Therein, the coils 210a-f are receiving coils, while the coil 220 is a transmitting coil (depicted as circular loop with a dashed line). The transmitting coil 220 has a substantially greater diameter than the receiving coils 210a-f. The receiving coils 210a-f are arranged on a circular line. In detail, they are arranged on the outer circumference of the circle formed by the transmitting coil 220, wherein the center points of the spatial extend of the receiving coils 210a-f are uniformly distributed along the circumference. Hence, it can be said that the receiving coils 210a-f at least partially and spatially overlap with the spatial extend of the transmitting coil 220. The receiving coils 210a-f may thereby be implemented in one plane, for example one layer of a substrate 105 of the package 200, whereas the transmitting coil 220 may be implemented in another plane, for example another layer of the substrate 105 of the package 200.

If the area covered by the transmitting coil 220 is larger than the area covered by at least one of the receiving coils 210a-f, the magnetic field generated by this transmitting coil 220 induces substantial currents/voltages in the receiving coils 210a-f. The portion of the induced current respectively voltage, which is not affected by the position of a target, which position should be sensed, is referred to as common mode current or common mode voltage or in general common mode signal. This common mode signal does not carry any position information with regards to the target. With the arrangement of the coils 210a-f, and 220 as shown in FIG. 4a this common mode signal is however be suppressed. The suppression is explained in context of FIG. 4b.

FIG. 4b shows the coil arrangement as depicted in FIG. 4a. The receiving coils 210a-f at least partially and spatially overlap the transmitting coil 220. In the here shown embodiment example, the receiving coils 210a-f are arranged as such, that substantially half of their spatial extend overlaps with the spatial extend of the transmitting coil 220. It can also be said one half of the receiving coils 210a-f lies within the spatial extend of the transmitting coil 220, whereas the other half lies outside of the spatial extend of the transmitting coil 220. This means each of the halves of the receiving coils 210a-f is passed through by a different magnetic flux $\phi_1$ and $\phi_2$ as indicated with the shaded areas of receiving coil 220. Also the different magnetic fluxes $\phi_1$ and $\phi_2$ are both generated by the same transmitting coil 220, $\phi_1$ and $\phi_2$ have different directions, as one magnetic flux $\phi_1$ is part of the magnetic flux outside the transmitting coil 220 and the other magnetic flux $\phi_2$ is part of the magnetic flux inside the transmitting coil 220. The induced property (voltage or current) within the receiving coils 210a-f is a superposition of the induced properties created by the two magnetic fluxes $\phi_1$ and $\phi_2$. In order to suppress the common mode signal, the effect the magnetic fluxes $\phi_1$ and $\phi_2$ have got on the receiving coils 210a-f must counteract each other. This is the case when the magnetic flux $\phi_1$ substantially equals the magnetic flux $\phi_2$ because then the induced property has substantially the same value, but one is positive and the other is negative. In the here shown embodiment example this is achieved by arranging the receiving coils 210a-f in such a way that half of their spatial extend overlaps with the spatial extend of the transmitting coil 220, whereas the other half does not. However, it is clear to a person skilled in the art that in other configurations also other overlaps have to be used. Thereby, it is important that the magnetic flux $\phi_1$ outside the overlap area is substantially the same as the magnetic flux $\phi_2$ inside the overlap area in order that the two magnetic fluxes cancel each other out. Since the magnetic flux is not linear, the two areas, hence the overlap area and the non-overlap area may be different in size. For example, since the overlap area will encounter a higher magnetic flux than the non-overlap area, the overlap area needs to be substantially smaller than the non-overlap area, such that in the non-overlap area still a high enough magnetic flux is encountered to cancel the magnetic flux within the overlap area. By this the common mode signal is suppressed without having an effect on the useable second magnetic field, which carries the position information of the target.

Figure 5:
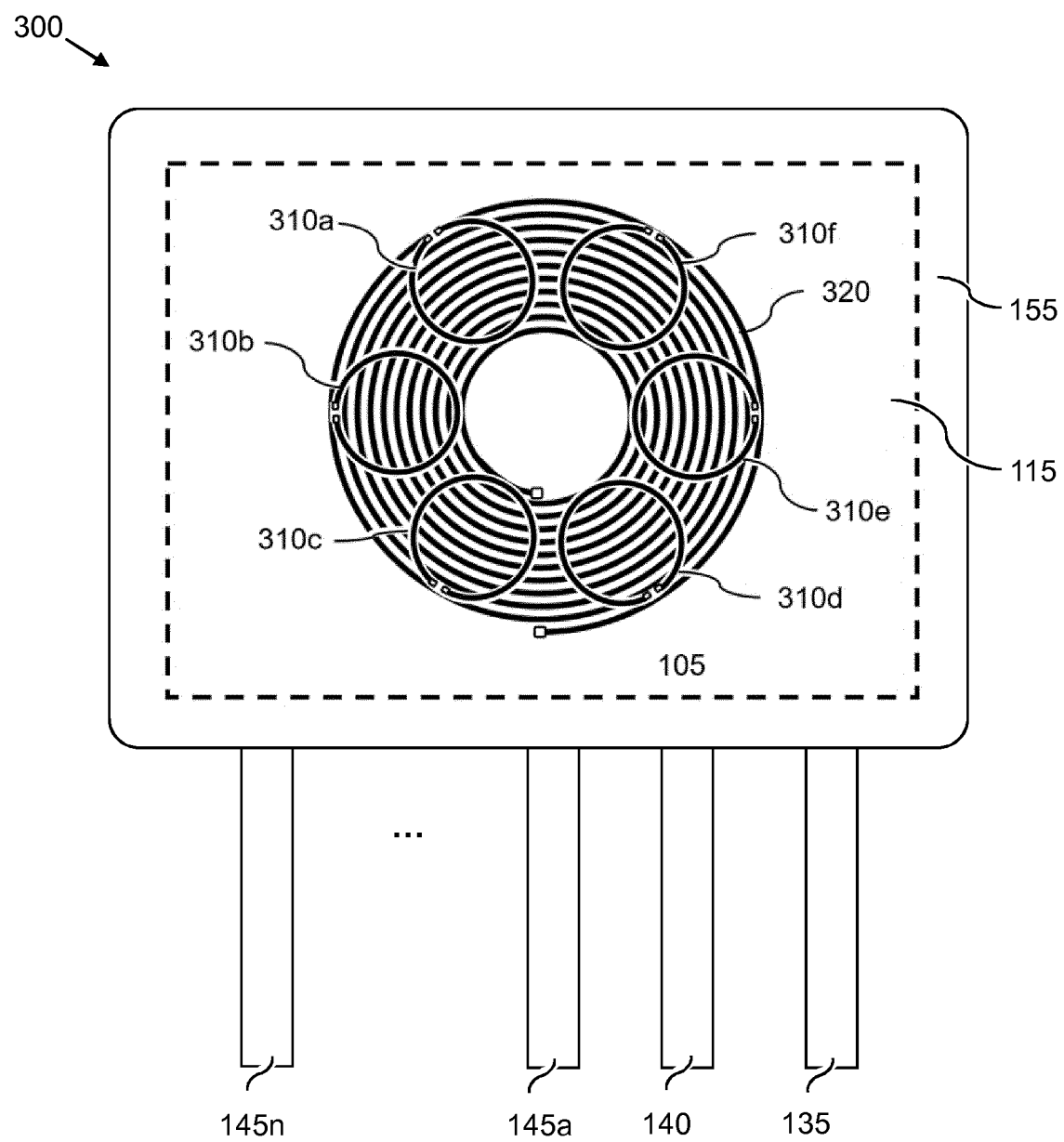

FIG. 5 shows a plan view of the sensor package 300 according to one embodiment example of the invention. In detail, FIG. 5 shows a plan view of the surface of the first side 115 of the non-conductive substrate 105. Similar to the sensor package 200 of FIG. 4, the sensor package 300 comprises six receiving coils 310a-f and one transmitting coil 320. In the here shown embodiment example, the transmitting coil 320 is implemented in a distributed way. In the here shown embodiment example, the spatial extend of the receiving coils 310a-f fully overlap with the spatial extend of the transmitting coil 320. Although in the here shown embodiment example, the transmitting coil 320 and the receiving coils 310a-f fully overlap, it is clear to a person skilled in the art that also the overlap can be less than the shown overlap. The transmitting coil 320 in the here shown embodiment example is implemented as wire in the shape of a spiral. The spiral may be substantially flat, such that the spiral shaped wire is arranged in a plane, for example in a layer of the substrate 105. The receiving coils 310a-f may be arranged in a plane distant to the one of the transmitting coil 320, for example in another layer of the substrate 105 or on the substrate 105. This arrangement of the receiving and transmitting coils 310a-f, 320 has the advantage of less sensitivity to manufacturing tolerances between coils. Although the coil loops in the here shown embodiment example are adjacent to each other, it is contemplated that they can also be spaced further apart, such that only a limited number of coil loops will overlap with the receiving coils 310a-f. In other word, it can also be said that at least a portion of at least one loop of the transmitting coil 320 intersects at least a portion of the spatial extend of the receiving coils 310a-f.

Figure 6:
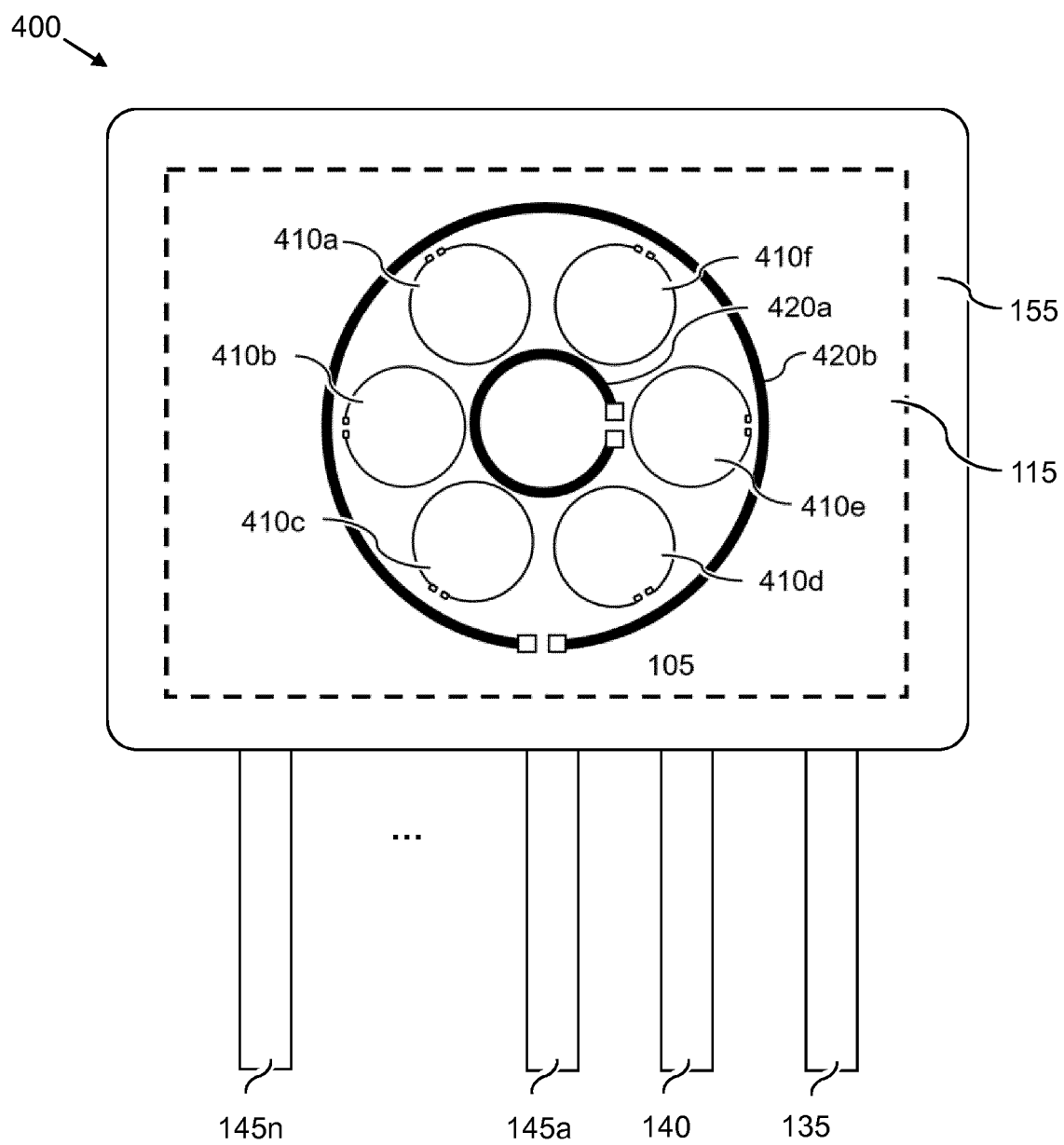

FIG. 6 shows a plan view of the sensor package 400 according to one embodiment example of the invention. In detail, FIG. 6 shows a plan view of the surface of the first side 115 of the non-conductive substrate 105. The sensor package 400 comprises six receiving coils 410a-f and two transmitting coils 420a, 420b (bold lines). Thereby, at least one transmitting coil 420b is arranged to surround the receiving coils 410a-f. Hence, the spatial extend of the receiving sensor elements 410a-f fully overlaps with the spatial extend of the transmitting coil 420b. It is clear to a person skilled in the art that also the overlap can be less than the shown overlap. Thereby, in the here shown embodiment example, transmitting coil 420b is depicted as a single wire loop surrounding the six receiving coils 410a-f. The other transmitting coil 420a is arranged in a center defined by connecting lines of the centers of differential pairs 410a/d, 410b/e, and 410c/f. This further transmitting coil 420a does not spatially overlap with the receiving coils 410a-f. Using the two transmitting coils 420a and 420b allows for suppressing the common mode signal without the need for an overlap of the transmitting coils 420a and 420b and the receiving coils 410a-f. For example, by having more turns and/or more current flowing in transmitting coil 420a as compared to transmitting coil 420b, a suppression of the common mode signal may be achieved. Hence, with such kind of arrangement, all the coils may be arranged within the same plane, for example the same layer of the substrate 105 or on the substrate 105.

The shape of the receiving and transmitting coils is not limited to circular shapes as depicted in FIGS. 2, 4a/b, 5, and 6. The coils may also be hexagonal or shaped like a sector of a circle, respective embodiment examples are shown in FIGS. 7 and 8.

Figure 7:
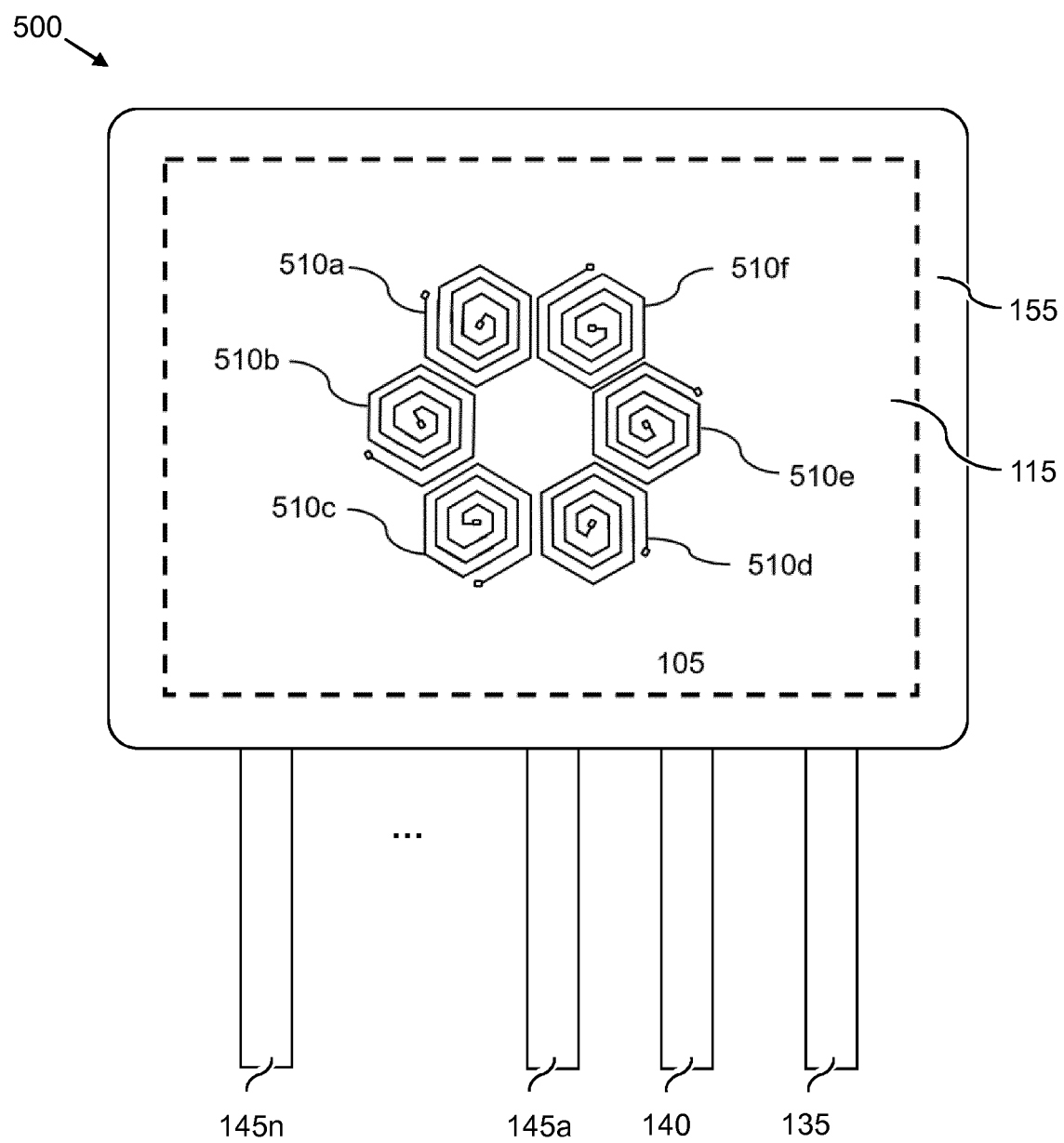

FIG. 7 shows a plan view of the sensor package 500 according to yet another embodiment example of the invention. In detail, FIG. 7 shows a plan view of the surface of the first side 115 of the non-conductive substrate 105. In the here shown embodiment example, six hexagonal shaped conductive coils 510a-f are present, which are arranged in a circle. Thereby, each coil 510a-f may comprise a wiring substantially in the shape of hexagonal spiral. In the here shown embodiment example, the coils 510a-f are adjacent to one another. The coils 510a-f may be configured to either generate a magnetic field or to receive a magnetic field. Further, they may be configured to change their operational mode from generating a magnetic field to receiving a magnetic field and vice versa. For example, in a first instance in time, the coils 510a and 510d may be the receiving coils, whereas the remaining coils 510b/c/e/f are the transmitting coils. The coils 510a and 510d may form a differential pair and output a differential signal. The differential signal may thereby be formed by forming the difference of the current or voltage values outputted by each of the receiving coils of a differential sensor pair. Thereby, one value of one receiving coils represents the minuend and the other value of the other receiving coil represents the subtrahend of the difference. By performing such a differential measurement, an influence which acts upon both receiving coils substantially alike is cancelled. For example, a stray field, which carries a magnetic flux, which influences both receiving coils alike is cancelled due to the difference building. At another instance in time, the coils 510b and 510e may be the receiving coils, whereas the remaining coils 510a/c/d/f are the transmitting coils. In this instance in time the coils 510b and 510e may form a differential pair and output a differential signal. In yet another instance in time, the coils 510c and 510f may be the receiving coils, whereas the remaining coils 510a/b/d/e are the transmitting coils. In this instance in time the coils 510c and 510f may form a differential pair and output a differential signal. The different differential signal can then be combined to determine the position of a target. It is clear that even so here a clockwise cyclic shift of the receiving coils is described that any arbitrary cyclic shift may be performed. Furthermore, even so it is described that differential pairs are formed and differential signals are outputted, it is clear to a person skilled in the art that each coil 510a-f individually may output a signal. Furthermore, it is clear that all coils 510a-f may independently change their operational modes from the receiving mode to the transmitting mode.

Figure 8:
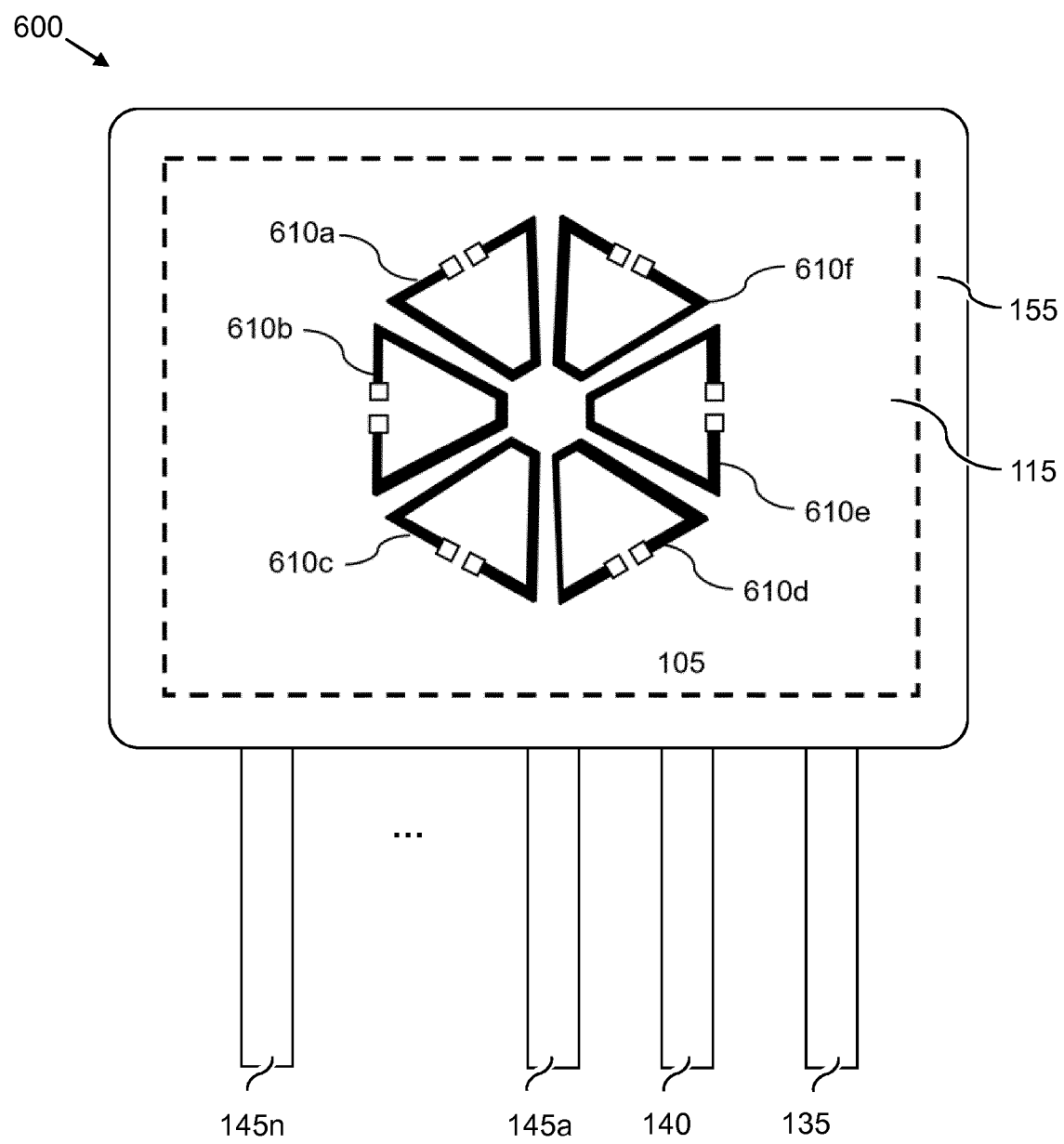

FIG. 8 shows a plan view of the sensor package 600 according to one embodiment example of the invention. In detail, FIG. 8 shows a plan view of the surface of the first side 115 of the non-conductive substrate 105. The sensor package 600 comprises six coils 610a-f, wherein the coils 610a-f are arranged in a circle. Each coil 610a-f may comprise a wire substantially in the shape of a sector of a circle, which may also be referred to as a shape of a trapezoid. Thereby, the wire of the coils 610a-f may comprise a single loop in the shape of a trapezoid or may comprise multiple loops in the shape of a trapezoid. The coils 610a-f may be configured to either generate a magnetic field or to receive a magnetic field. Further, they may be configured to change their operational mode from generating a magnetic field to receiving a magnetic field and vice versa. For example, in a first instance in time, the coils 610a and 610d may be the receiving coils, whereas the remaining coils 610b/c/e/f are the transmitting coils. The coils 610a and 610d may form a differential pair and output a differential signal. At another instance in time, the coils 610b and 610e may be the receiving coils, whereas the remaining coils 610a/c/d/f are the transmitting coils. In this instance in time the coils 610b and 610e may form a differential pair and output a differential signal. In yet another instance in time, the coils 610c and 610f may be the receiving coils, whereas the remaining coils 610a/b/d/e are the transmitting coils. In this instance in time the coils 610c and 610f may form a differential pair and output a differential signal. The different differential signal can then be combined to determine the position of a target. It is clear that even so here a clockwise cyclic shift of the receiving coils is described that any arbitrary cyclic shift may be performed. Furthermore, even so it is described that differential pairs are formed and differential signals are outputted, it is clear to a person skilled in the art that each coil 510a-f individually may output a signal. Furthermore, it is clear that all coils 610a-f may independently change their operational modes from the receiving mode to the transmitting mode.

Although the Figures depicted herein refer to explicit coil arrangements and coil shapes, it is clear to the person skilled in the art that further arrangements and shapes are also possible. Any shape of the coils, which maintains the rotational symmetry with respect to the number of receiving coils is possible. For example, an embodiment of three coils may comprise substantially triangular coil shapes and an embodiment of five coils may comprise substantially pentagonal coil shapes.

It is also clear to the person skilled in the art that a suitable number of receiving coils may be associated with the shape or form a target, which position shall be sensed. For example, an embodiment of a rotational sensor comprising three receiving coils may be sensitive for sensing the position of a target from 0° to 180°. In another embodiment of a rotational sensor, an arrangement comprising five receiving coils may be sensitive for sensing the position of a target from 0° to 360°. In general, using more receiving coils may provide a lower amplitude of the induced voltages and the processing of a higher number of signals received from the receiving coils may be more complex.

What has been described above includes examples of one or more embodiments. It is, of course, not possible to describe every conceivable combination of elements, components, or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims.

The invention claimed is:

1. A sensor package comprising:
   a non-conductive substrate;
   at least two electrically conductive coils located at a first side of the non-conductive substrate;
   an evaluation circuit located at a second side of the non-conductive substrate opposing the first side of the non-conductive substrate; and
   conductive connections between the at least two electrically conductive coils and the evaluation circuit,
   wherein the evaluation circuit is configured to determine a position of the target and/or a change of position of the target,
   wherein the at least two electrically conductive coils include a transmitting coil and a plurality of receiving coils,
   wherein an area covered by the transmitting coil is larger than an area covered by at least one of the receiving coils,
   wherein the plurality of receiving coils are arranged on an outer circumference of the transmitting coil which has a shape of a circle such that the areas of each of the plurality of receiving coils at least partially overlaps with the area of the transmitting coil, and
   wherein center points of the plurality of receiving coils are distributed along the outer circumference of the transmitting coil.

2. The sensor package according to claim 1, wherein the substrate comprises an electrically isolating, non-metallic, and/or low dielectric loss material.

3. The sensor package according to claim 1, wherein the substrate is configured to impart substantial structural rigidity or wherein a lead-frame is configured to impart structural rigidity.

4. The sensor package according to claim 1, wherein the substrate comprises connection pads on the second side of the substrate for connecting the at least two electrically conductive coils with the evaluation circuit.

5. The sensor package according to claim 1, wherein the evaluation circuit is mounted as a flip chip onto the second side of the substrate.

6. The sensor package according to claim 1, wherein the at least two electrically conductive coils are integrated at least partially into the substrate on the first side of the substrate.

7. The sensor package according to claim 1, wherein the at least two electrically conductive coils do not structurally overlap each other or at least partially structurally overlap each other.

8. The sensor package according to claim 1, wherein one of the at least two electrically conductive coils produces a magnetic field and the other of the at least two electrically conductive coils receives the magnetic field.

9. The sensor package according to claim 1, wherein the evaluation circuit is a semiconductor device.

10. The sensor package according to claim 1, further comprising:
    a lead frame arranged only on the second side of the substrate.

11. The sensor package according to claim 10, wherein the evaluation circuit is connected to the lead frame by wire bonds or mounted as a flip chip onto the lead frame or wherein the evaluation circuit is connected to the lead frame via the substrate.

12. The sensor package according to claim 1, wherein the at least two electrically conductive coils on the first side of the substrate define a first area and wherein the evaluation circuit is arranged on the second side of the substrate within a second area directly opposing the first area.

13. The sensor package according to claim 1, further comprising:
    at least one terminal, wherein the at least one terminal is one of a supply terminal, an input terminal and an output terminal, wherein the at least one terminal is connected to the evaluation circuit and/or to at least one of the at least two electrically conductive coils.

14. The sensor package according to claim 1, further comprising:
    at least one passive component that is located at the second side of the non-conductive substrate.

15. The sensor package according to claim 1, wherein the sensor package is encapsulated by mold material.

16. The sensor package according to claim 1, wherein the evaluation circuit is configured to determine a rotational position of the target.

17. The sensor package according to claim 1, wherein the evaluation circuit is configured to determine a linear position of the target.

18. The sensor package according to claim 1, wherein the evaluation circuit is configured to determine a linear movement of the target.

19. The sensor package according to claim 1, wherein the evaluation circuit is configured to determine a rotational movement of the target.

20. The sensor package according to claim 1, wherein the evaluation circuit is configured to determine a rotational position of the target, a linear position of the target, a linear movement of the target, and a rotational movement of the target.

21. The sensor package according to claim 1, wherein the center points of the plurality of receiving coils are uniformly distributed along the outer circumference of the transmitting coil.

22. The sensor package according to claim 1, wherein the at least two electrically conductive coils include at least one transmitting coil and at least one receiving coil,
    wherein the at least one receiving coil is configured to couple inductively with the at least one transmitting coil, and
    wherein the at least one receiving coil is configured for receiving a magnetic field that is influenced by the target in a predetermined direction, wherein the predetermined direction is defined by a predetermined structure of the target, the predetermined structure of the target influencing magnetic field lines of a magnetic field transmitted by the at least one transmitting coil.

23. The sensor package according to claim 1, wherein the at least two electrically conductive coils include at least one transmitting coil that transmits a magnetic field and at least one receiving coil,
    wherein the at least one receiving coil is configured to couple inductively with the at least one transmitting coil, and
    wherein the at least one receiving coil is arranged for accounting for different impinging field situations of the magnetic field due to a geometry of structures of the target.

24. A sensor package comprising:
    a non-conductive substrate;
    at least two electrically conductive coils located at a first side of the non-conductive substrate;
    an evaluation circuit located at a second side of the non-conductive substrate opposing the first side of the non-conductive substrate; and conductive connections between the at least two electrically conductive coils and the evaluation circuit, wherein the evaluation circuit is configured to determine a position of the target and/or a change of position of the target wherein the at least two electrically conductive coils include a transmitting coil and a plurality of receiving coils, wherein an area covered by the transmitting coil is larger than an area covered by at least one of the receiving coils, wherein the plurality of receiving coils are arranged on an outer circumference of the transmitting coil such that the areas of each of the plurality of receiving coils at least partially overlap with the area of the transmitting coil wherein center points of the plurality of receiving coils are distributed along the outer circumference of the transmitting coil.

\* \* \* \* \*